(12) United States Patent
Omura et al.

(10) Patent No.: US 7,888,754 B2
(45) Date of Patent: Feb. 15, 2011

(54) MEMS TRANSDUCER

(75) Inventors: Masayoshi Omura, Hamamatsu (JP); Tamito Suzuki, Fukuroi (JP); Yukitoshi Suzuki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 139 days.

(21) Appl. No.: 12/317,692

(22) Filed: Dec. 23, 2008

(65) Prior Publication Data

US 2009/0200620 A1 Aug. 13, 2009

(30) Foreign Application Priority Data

Dec. 28, 2007 (JP) ............ P2007-341426
Dec. 28, 2007 (JP) ............ P2007-341440

(51) Int. Cl.
*H01L 29/84* (2006.01)

(52) U.S. Cl. ............... 257/419; 257/E29.324

(58) Field of Classification Search ........ 257/419, 257/E29.324
See application file for complete search history.

(56) References Cited

U.S. PATENT DOCUMENTS 4,776,019 A 10/1988 Horiba
7,538,401 B2 * 5/2009 Eriksen et al. ............ 257/419
7,781,249 B2 * 8/2010 Laming et al. ............ 438/51
2008/0089181 A1 * 4/2008 Adachi et al. ............ 367/189

FOREIGN PATENT DOCUMENTS

JP 9-508777 2/2004
JP 2004-506394 2/2004

OTHER PUBLICATIONS

Tajima, et al., "Mechanical Properties of Capacitive Silicon Microphone," MSS-01-34, Japanese Institute of Electrical Engineers (Tohoku, Japan), p. 95-98.

* cited by examiner

*Primary Examiner*—Trung Dang
(74) *Attorney, Agent, or Firm*—Pillsbury Winthrop Shaw Pittman LLP

(57) ABSTRACT

An MEMS transducer is constituted of a diaphragm, a plate, a support structure for supporting the diaphragm and the plate with a gap layer surrounded by an interior wall, an electrode film (e.g. a pad conductive film) for covering a contact hole formed in the support structure, and a protective film (e.g. a pad protective film) which is formed on the support structure externally of the interior wall so as to cover the side surface of the electrode film having low chemical stability. The protective film is formed in the limited area including a part of the surface of the electrode film except for its center portion and the surrounding area of the electrode film. This allows the protective film to use materials having high membrane stress such as silicon nitride or silicon nitride oxide.

6 Claims, 21 Drawing Sheets

MEMS TRANSDUCER

BACKGROUND OF THE INVENTION

1. Field of the Invention

The present invention relates to MEMS (Micro Electro Mechanical System) transducers applied to MEMS sensors used in miniature condenser microphones, vibration sensors, pressure sensors, and acceleration sensors, for example.

The present invention also relates to manufacturing methods of MEMS transducers.

The present application claims priority on Japanese Patent Application No. 2007-341440, and Japanese Patent Application No. 2007-341426, the contents of which are incorporated herein by reference.

2. Description of the Related Art

Various types of miniature condenser microphones, which are manufactured by use of manufacturing processes of semiconductor devices, have been developed and disclosed in various documents such as Patent Documents 1, 2, 3, and Non-Patent Document 1.

Patent Document 1: Japanese Patent Application Publication No. H09-50877
Patent Document 2: Japanese Patent Application Publication No. 2004-506394
Patent Document 3: U.S. Pat. No. 4,776,019
Non-Patent Document 1: MSS-01-34 published by Japanese Institute of Electrical Engineers Condenser microphones have been referred to as MEMS microphones, each of which is designed such that a diaphragm and a plate (which are formed using thin films so as to form opposite electrodes of a parallel-plate condenser) are separated from each other and are supported above a substrate. When the diaphragm vibrates due to sound waves, the displacement thereof occurs so as to vary electrostatic capacitance of the condenser, so that variations of electrostatic capacitance are converted into electric signals. MEMS transducers serving as condenser microphones are covered with protective films on the surfaces thereof, wherein through-holes are formed in protective films so as to expose electrodes. The protective films having insulating properties are used to protect MEMS transducers from chemical corrosions (due to water, oxygen, and sodium) and physical damages.

Relatively high stresses occur on deposited films composed of nitride materials and nitrogen oxide materials which are deposited on silicon substrates and silicon oxide films due to differences in thermal expansion coefficients. When nitride materials and nitrogen oxide materials are used for protective films, distortions may occur in MEMS transducers having mechanical structures. This may damage the mechanical functions of MEMS transducers.

SUMMARY OF THE INVENTION

It is an object of the present invention to provide an MEMS transducer which is formed to protect electrodes thereof without damaging mechanical functions thereof.

It is another object of the present invention to provide a manufacturing method of the MEMS transducer.

In one embodiment of the present invention, an MEMS transducer is constituted of a diaphragm having conductivity, a plate having conductivity, and a support structure for supporting the diaphragm and the plate with a gap layer therebetween wherein the support structure has an interior wall surrounding the gap layer, an electrode film having conductivity for covering a contact hole formed in the support structure, and a protective film which is formed on the support structure externally of the interior wall so as to cover a side surface of the electrode film, wherein an electric signal corresponding to variations of an electrostatic capacitance formed between the diaphragm and the plate is output via the electrode film.

Since the protective film (e.g. a pad protective film) is formed externally of the interior wall of the support structure, it is possible to prevent the diaphragm or the plate from being distorted in shape due to the direct influence of the membrane stress of the protective film; this makes it possible to form the protective film by use of materials having high membrane stresses. The side surface of the electrode film (e.g. a pad conductive film defining the outline of a pad) is lowered in chemical stability because it is activated in etching and because chemicals such as chloride and fluorine may remain after etching. The present invention allows the side surface of the electrode film having low chemical stability to be covered with the protective film composed of high-protective materials having high membrane stress. Thus, it is possible to protect the electrode film without damaging the mechanical function of the MEMS transducer.

It is preferable that the protective film be composed of silicon nitride or silicon nitride oxide.

It is preferable that the support structure have a multilayered structure including a silicon substrate and a silicon oxide film (e.g. a surface insulating film), which joins the silicon substrate except for its periphery, wherein the protective film is formed in the region extended between the periphery of the silicon substrate and the periphery of the silicon oxide film. This prevents movable ions from entering into the edges of the joint surface between the silicon substrate and the silicon oxide film.

In a manufacturing method adapted to the MEMS structure, the diaphragm and the plate are supported with a gap layer therebetween by means of the support structure having the interior wall surrounding the gap layer; the contact hole is formed in the support structure; the electrode film having conductivity is formed to cover the contact hole; and then, the protective film is formed to cover the side surface of the electrode film externally of the interior wall of the support structure.

In another embodiment of the present invention, an MEMS transducer is constituted of a diaphragm having conductivity, a plate having conductivity, an insulating member for insulating the diaphragm from the plate, an electrode film (e.g. a pad conductive film) which is composed of a conductive film so as to cover a contact hole formed in the insulating member, and a protective film (e.g. a pad protective film) which is limitedly formed in a part of the surface of the electrode film and the surrounding area of the electrode film on the surface of the insulating member, thus covering the side surface of the electrode film, wherein an electric signal corresponding to variations of electrostatic capacitance formed between the diaphragm and the plate is output from the electrode film.

Since the protective film is formed in the limited surrounding area of the electrode film, it is possible to use the material having relatively high membrane stress for the protective film. The side surface defining the outline of the electrode film may be lowered in chemical stability due to dry etching and due to remaining chemicals such as chloride and fluorine. In the present invention, the side surface of the electrode film which bears low chemical stability is covered with the protective film composed of nitrides and nitric oxides having high protective properties; hence, it is possible to reliably protect the electrode film without damaging the mechanical function of the MEMS transducer.

Since the present invention prevents the distortion occurring due to the protective film from being directly applied to the MEMS transducer, it is possible to use silicon nitride and silicon nitride oxide as the material of the protective film.

In the manufacturing method of the MEMS transducer, a contact hole is formed in the insulating member; the electrode film is formed to cover the contact hole of the insulating member; then, the protective film is limitedly formed on a part of the surface of the electrode film and the surrounding area of the electrode film on the surface of the insulating member, thus covering the side surface of the electrode film.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENTS

The present invention will be described in further detail by way of examples with reference to the accompanying drawings.

1. First Embodiment (1) Constitution

Figure 1:
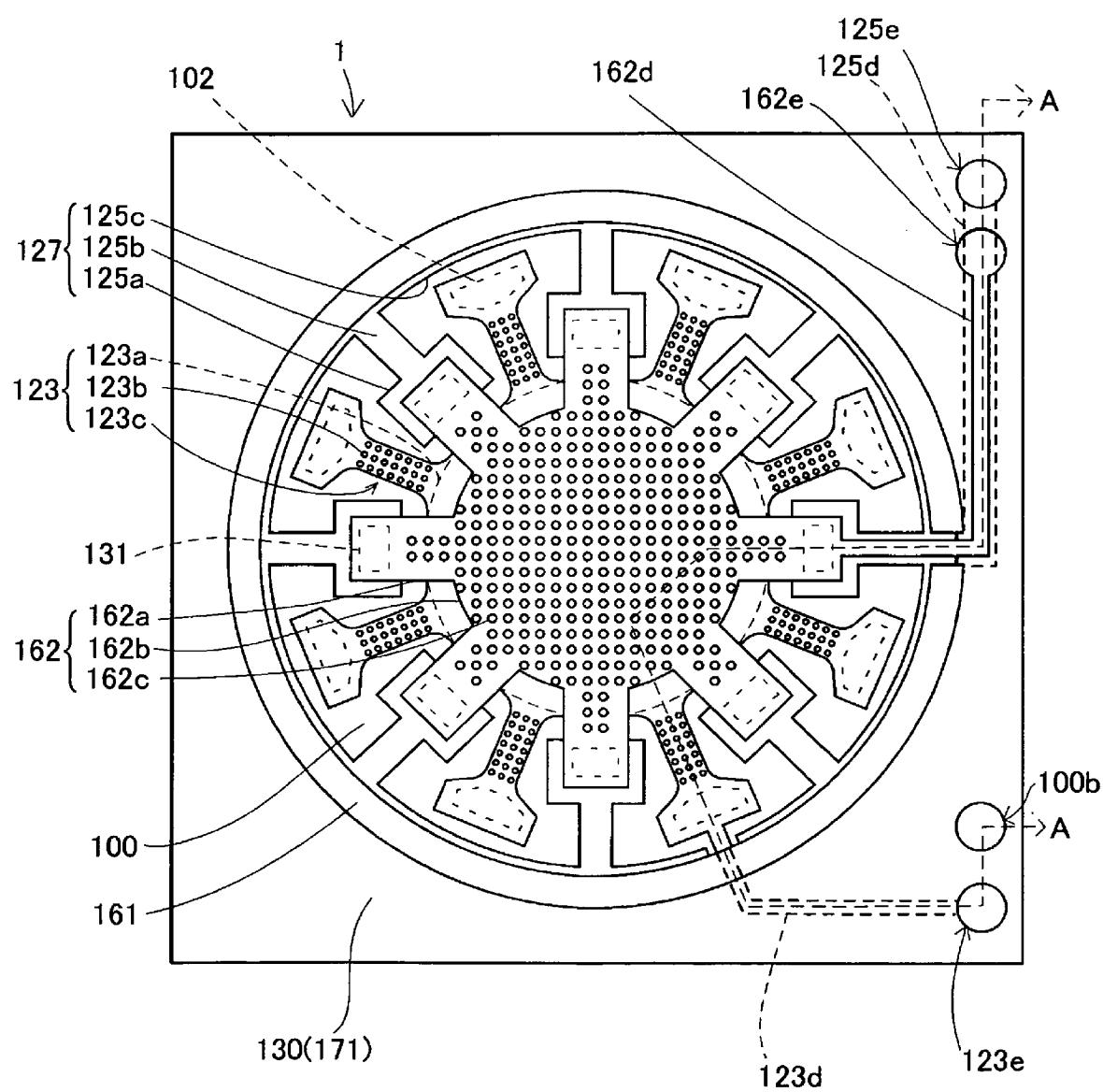
FIG. 1 is a plan view showing a sensor die included in a condenser microphone in accordance with a first embodiment of the present invention.
Figure 2:
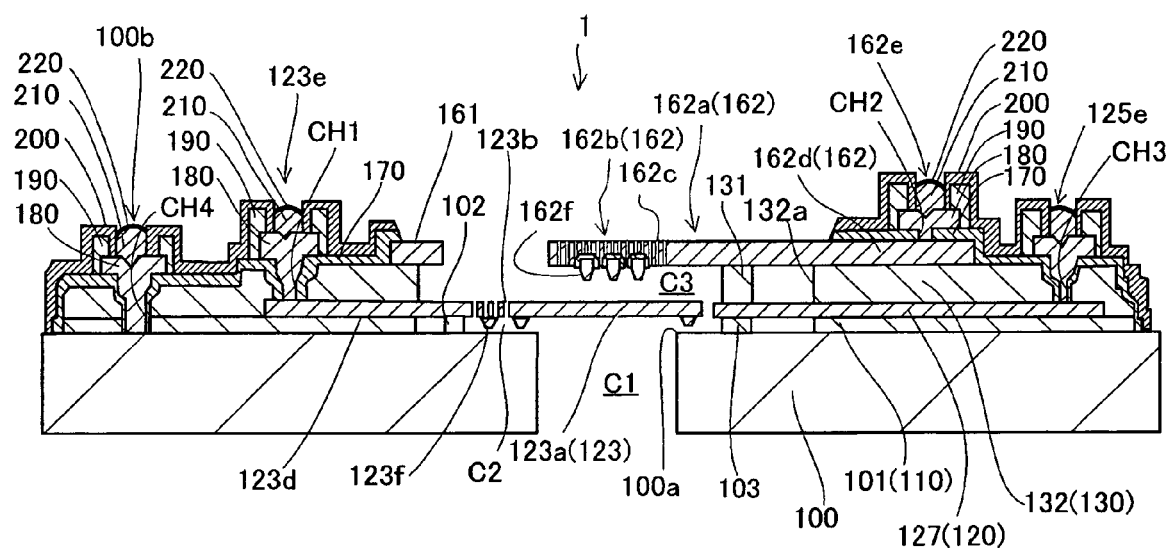
FIG. 2 is a longitudinal sectional view taken along line A-A in FIG. 1.
Figure 3:
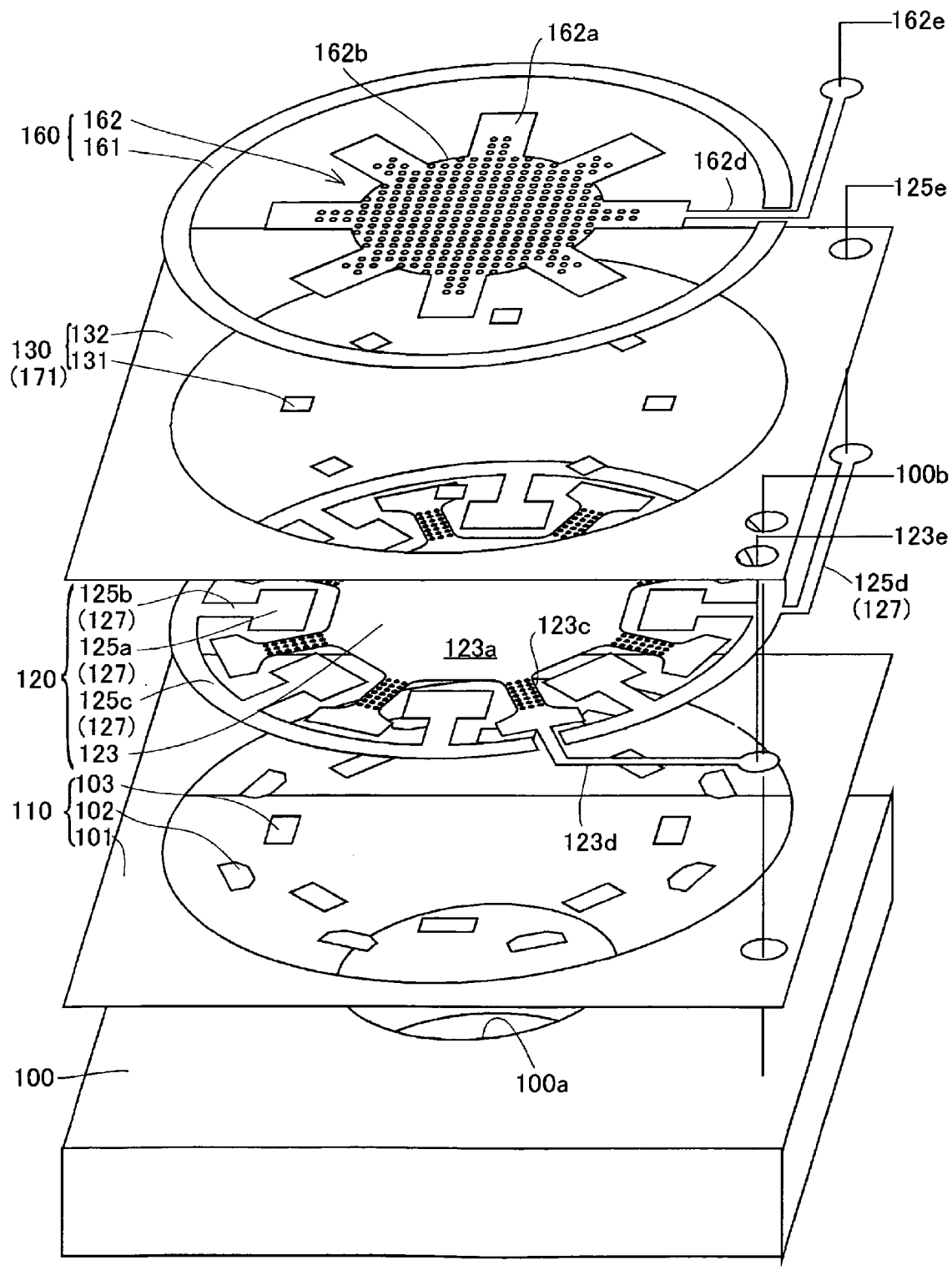
FIG. 3 is an exploded perspective view showing the film-laminating structure of the sensor die.

FIG. 1 shows a sensor die 1 of a condenser microphone (i.e. an example of an MEMS transducer) in accordance with a first embodiment of the preset invention. FIG. 2 is a sectional view take along line A-A in FIG. 1 with respect to the sensor die 1; and FIG. 3 shows the film-laminating structure of the sensor die 1. For the sake of simplification of illustrations, FIGS. 1 and 3 omit higher layers (which are shown in FIG. 2) formed above an upper conductive layer. The condenser microphone is constituted of the sensor die 1, a circuit die (including a voltage supply and an amplifier, not shown), and a package (not shown) for enclosing them.

The sensor die 1 is a movable component having a film-laminating structure including a substrate 100, a lower insulating film 110, a lower conductive film 120, an upper insulating film 130, an upper conductive film 160, a surface insulating film 170, pad conductive films 180, bump films 210, bump protective films 220, pad protective films 190, and a plating protective film 200.

The substrate 100 is composed of P-type monocrystal silicon; but this is not a restriction. The substrate 100 can be composed of any types of materials having desired values of rigidity, thickness, and strength for depositing thin films thereon and for supporting structures constituted of thin films.

The lower insulating film 110 is formed on the substrate 100 and is composed of silicon oxide (SiOx). The lower insulating film 110 is used to form a ring-shaped portion (actually a rectangular portion having a circular hole) 101, a plurality of diaphragm spacers 102 (which are aligned inside the ring-shaped portion 101), and a plurality of guard insulators 103 (which are aligned inside the ring-shaped portion 101).

The lower conductive film 120 is formed on the lower insulating film 110 and is composed of polycrystal silicon entirely doped with impurities such as phosphorus (P). The lower conductive film 120 is used to form a guard 127 and a diaphragm 123.

The upper insulating film 130 is formed on the lower conductive film 120 and the lower insulating film 110 and is composed of silicon oxide. The upper insulating film 130 is used to form a ring-shaped portion (actually a rectangular portion having a circular hole) 132, and a plurality of plate spacers 131 (which are aligned inside the ring-shaped portion 132).

The upper conductive film 160 is formed on the upper insulating film 130 and is composed of polycrystal silicon entirely doped with impurities such as phosphorus (P). The upper conductive film 160 is used to form a plate 162 and an etching stopper ring 161.

The surface insulating film 170 is formed on the upper conductive film 160 and the upper insulating film 130 and is composed of silicon oxide.

The plating protective film 200 composed of silicon oxide is exposed on the surface of the sensor die 1.

The sensor die 1 includes the diaphragm 123 and the plate 162 as well as multilayered supports, and four terminals 125e, 162e, 123e, and 100b.

Next, the constituent elements of the sensor die 1 will be described below.

The diaphragm 123 is formed using the lower conductive film 120 and is constituted of a center portion 123a, a plurality of arms 123c, and a diaphragm lead 123d. The center portion 123a is supported in parallel with the surface of the substrate 100 by means of the diaphragm spacers 102 and is positioned to cover an opening 100a of a back cavity C1 formed at the center of the substrate 100. The arms 123c are extended externally from the center portion 123a in a radial direction. Due to the formation of cutouts between the arms 123c, the rigidity of the diaphragm 123 is lower than the rigidity of a foregoing diaphragm having no arm (not shown). In addition, a plurality of diaphragm holes 123b is formed in the arms 123c, which are thus lowered in rigidity. A gap layer C2 whose height substantially matches the thickness of the diaphragm spacers 102 is formed between the substrate 100 and the diaphragm 123. The gap layer C2 is used to establish a balance between the internal pressure of the back cavity C1 and the atmospheric pressure. The diaphragm lead 123d is extended from the distal end of a prescribed one of the arms 123c toward the diaphragm terminal 123e via a slit of a guard ring 125c included in the guard 127 (see FIG. 3). Since the diaphragm terminal 123e is short-circuited to the substrate terminal 100b via the circuit die (not shown), the same potential is set to the diaphragm terminal 123e and the substrate terminal 100b. A plurality of diaphragm bumps 123f is formed on the backside of the diaphragm 123 positioned opposite to the surface of the substrate 100. The diaphragm bumps 123f prevent the diaphragm 123 from being fixed to the substrate 100.

The plate 162 is supported in parallel with the diaphragm 123 by the plate spacers 131 in such a way that the center thereof matches the center of the diaphragm 123 in plan view. The plate 162 is formed using the upper conductive film 160 and is constituted of a center portion 162b, a plurality of arms 162a (which are extended externally from the center portion 162b in a radial direction), and a plate lead 162d. A plurality of plate holes 162c is formed in the plate 162. The plate holes 162c allow an etchant (for use in isotropic etching on the upper insulating film 130) to flow therethrough. The remaining portion of the upper insulating film 130 after etching is used to form the plate spacers 131 and the ring-shaped portion 132, while the other portion thereof (which is removed by etching) is used to form a gap layer C3 between the diaphragm 123 and the plate 162. The plate holes 162c are aligned in consideration of the height of the gap layer C3, the shapes of the plate spacers 131, and the etching speed. The plate lead 162d whose width is smaller than the width of the arm 162a is extended from the distal end of a prescribed one of the arms 162a of the plate 162. The wiring path of the plate lead 162d overlaps the wiring path of a guard lead 125d (see FIG. 3) in plan view. This reduces the parasitic capacitance between the plate lead 162d and the substrate 100. A plurality of projections (i.e. plate bumps) 162f is formed on the backside of the plate 162 positioned opposite to the surface of the diaphragm 123. The plate bumps 162f are formed using a silicon nitride (SiN) film (which joins the upper conductive film 160 used for the formation of the plate 162) and a polycrystal silicon film (joining the silicon nitride film). The plate bumps 162f prevent the plate 162 from being fixed to the diaphragm 123.

Next, the support structure for supporting the diaphragm 123 and the plate 162 will be described in detail.

The support structure is constituted of the substrate 100, the lower insulating film 110, the upper insulating film 130, the surface insulating film 170, and the plating protective film 200.

A though-hole having the opening 100a is formed to run through the substrate 100 in its thickness direction, thus forming the back cavity C1 which is closed by a package substrate (not shown).

The diaphragm spacers 102 (which are formed using the lower insulating film 110) are aligned with equal spacing therebetween in the surrounding area of the opening 100a of the back cavity C1 in a circumferential direction. The diaphragm spacers 102 support the diaphragm 123 above the substrate 100 via a gap layer C2 while insulating the diaphragm 123 from the plate 162.

The plate spacers 131 (which are formed using the upper insulating film 130) join guard electrodes 125a (which are formed using the lower conductive layer 120). The plate spacers 131 support the plate 162 above the diaphragm 123 with the gap layer C3 therebetween. The plate spacers 131 are positioned in the cutouts formed between the adjacent arms 123a of the diaphragm 123. The guard electrodes 125a are supported above the substrate 100 via the guard insulators 103 (which are formed using the lower insulating film 110). That is, the plate 162 is supported above the substrate 100 by means of the guard insulators 103, the guard electrodes 125a, and the plate spacers 131.

The gap layer C3 formed between the diaphragm 123 and the plate 162 is surrounded by an interior wall 132a of the ring-shaped portion 132 of the upper insulating film 130.

Next, the terminal structure of the sensor die 1 of the condenser microphone will be described with reference to FIGS. 4A to 4D.

The sensor die 1 is equipped with the four terminals 125e, 162e, 123e, and 100b, all of which are formed using the pad conductive films 180, the bump films 210, and the bump protective films 220 as shown in FIGS. 4A to 4D.

Figure 4A:
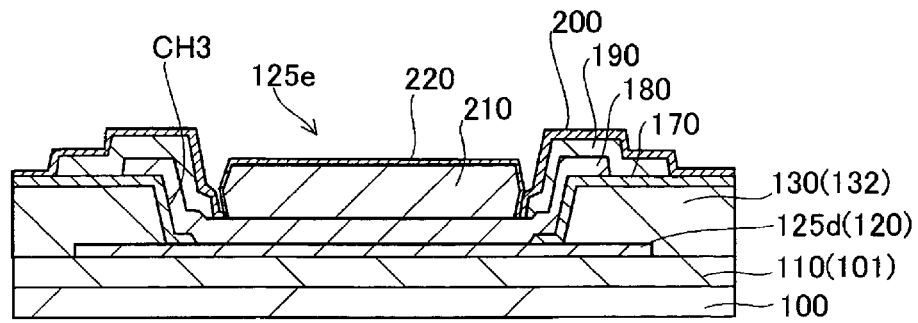
FIG. 4A is a cross-sectional view showing the formation of a guard terminal.
Figure 4B:
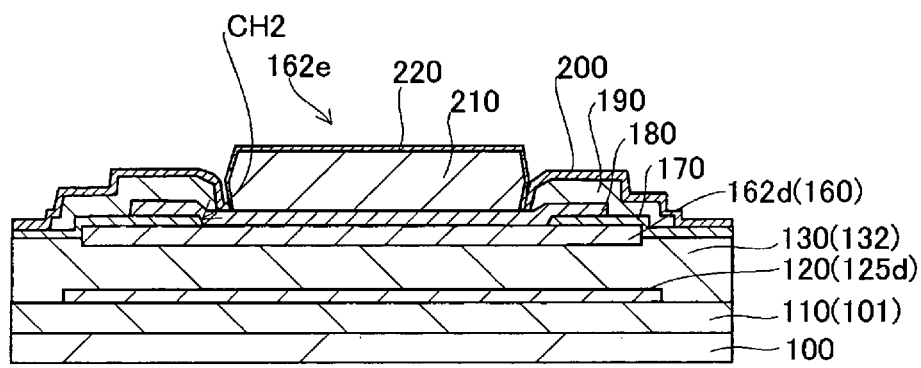
FIG. 4B is a cross-sectional view showing the formation of a plate terminal.
Figure 4C:
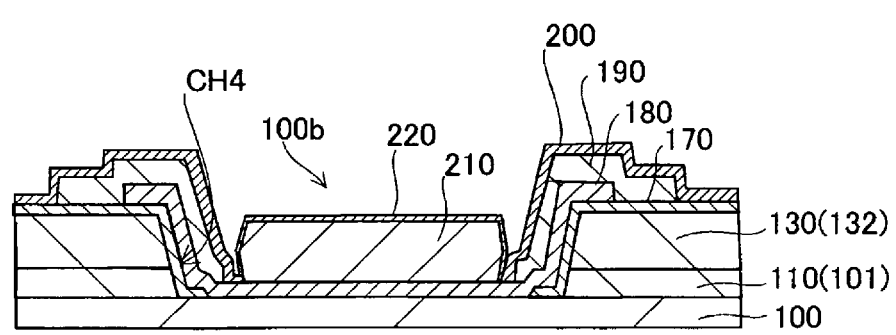
FIG. 4C is a cross-sectional view showing the formation of a substrate terminal.
Figure 4D:
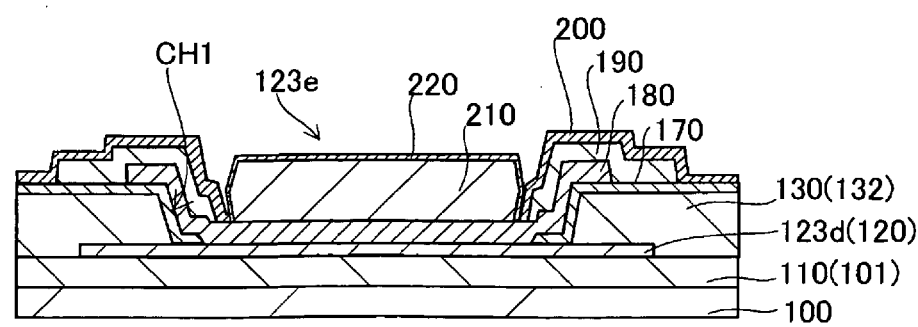
FIG. 4D is a cross-sectional view showing the formation of a diaphragm terminal.

The pad conductive films 180 are mainly composed of aluminum. The pad conductive films 180 contain silicon at 1% in order to prevent silicon materials from being diffused from the upper conductive film 160 to the pad conductive films 180. As shown in FIG. 4A, the pad conductive film 180 covering a contact hole CH3 join the guard lead 125d. As shown in FIG. 4B, the pad conductive film 180 covering a contact hole CH2 joins the plate lead 162d. As shown in FIG. 4C, the pad conductive film 180 covering a contact hole CH4 joins the substrate 100. As shown in FIG. 4D, the pad conductive film 180 covering a contact hole CH1 joins the diaphragm lead 123d.

The pad protective films 190 are formed on the surface insulating film 170 and the pad conductive films 180 so as to cover the side surfaces of the pad conductive films 180 (which are terminal surfaces formed by way of etching). The pad protective films 190 are composed of silicon nitride or silicon oxide nitride. As shown in FIG. 13B, the pad protective films 190 are formed to surround the pad conductive films 180 on the surface of the surface insulating film 170 forming the support structure. Specifically, the pad protective films 190 are each formed in the limited areas externally of the interior wall 132a of the ring-shaped portion 132, i.e. the area of the pad conductive film 180 except for a part of its surface and the area surrounding the pad conductive film 180 on the surface of an insulating member 171 (corresponding to the upper insulating film 130), thus covering the side surfaces of the pad conductive films 180. The pad protective films 190 are isolated from each other and are formed in connection with the terminals 125e, 162e, 123e, and 100b. That is, the pad conductive films 190 cover only the limited areas of the sensor die 1, wherein they do not cover the plate 162. For this reason, even though the pad protective films 190 are composed of silicon nitride having a relatively high membrane stress, they do not damage the function of the sensor die 1. If the pad protective films 190 are formed inwardly of the interior wall 132a of the ring-shaped portion 132, the pad protective films 190 are inevitably connected to the plate 162, which is thus distorted in shape. This varies the height of the gap layer C2 between the plate 162 and the diaphragm 123, thus damaging the function of the sensor die 1 and causing dispersions in characteristics of the sensor die 1.

The bump films 210 are formed in the prescribed areas of the surfaces of the pad conductive films 180 which are not covered with the pad protective films 190. In other words, the pad protective films 190 are formed on the prescribed areas of the surfaces of the pad conductive films 180 except for their bump forming areas. The bump films 210 are composed of nickel.

The surfaces of the bump films 210 are covered with the bump protective films 220, which are exposed on the surface of the sensor die 1. The bump films 220 are composed of metals having superior corrosion resistances such as gold (Au).

The guard 127 is constituted of the guard electrodes 125a, the guard connectors 125b, the guard ring 125c, and the guard lead 125d. The guard 127 reduces the parasitic capacitance formed between the diaphragm 123 and the plate 162.

(2) Operation

A bias voltage which is stabilized by a charge pump installed in the circuit die is applied to the diaphragm 123. Sound waves entering into the through-hole of a package (not shown) are transmitted to the diaphragm 123 via the plate holes 162c and the cutouts between the arms 162a of the plate 162. Since sound waves having the same phase are propagated along both the surface and the backside of the plate 162, the plate 162 does not vibrate substantially. Sound waves reaching the diaphragm 123 cause vibration of the diaphragm 123. Vibrating the diaphragm 123 varies the electrostatic capacitance of a parallel-plate condenser whose opposite electrodes correspond to the pate 162 and the diaphragm 123. Electric signals corresponding to variations of the electrostatic capacitance formed between the plate 162 and the diaphragm 123 are picked up as potential differences occurring between the diaphragm terminal 123e and the plate terminal 162e, whereby they are output from the sensor die 1. Electric signals representative of voltages are amplified by an amplifier (not shown) of the circuit die. That is, electric signals corresponding to variations of the electrostatic capacitance between the plate 162 and the diaphragm 123 are output via the pad conductive films 180 forming the diaphragm terminal 123e and the plate terminal 162e. In this connection, the charge pump and the amplifier can be installed in the sensor die 1.

(3) Manufacturing Method

Next, the manufacturing method of the condenser microphone will be described with reference to FIGS. 5 to 12, 13A, 13B, and 14 to 21.

Figure 5:
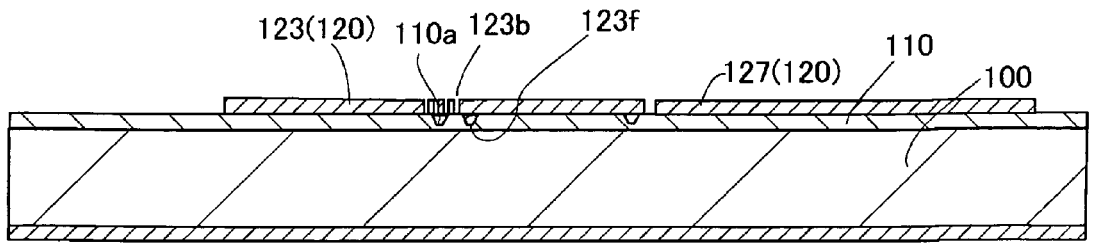
FIG. 5 is a sectional view used for explaining a first step of a manufacturing method of the condenser microphone.

In a first step of the manufacturing method shown in FIG. 5, the lower insulating film 110 which is a deposited film composed of silicon oxide is formed on the entire surface of the substrate 100. Dimples 110a used for the formation of the diaphragm bumps 123f are formed in the lower insulating film 110 by way of etching using a photoresist mask. The lower conductive film 120 which is a deposited film composed of polycrystal silicon is formed on the surface of the lower insulating film 110 by way of Chemical Vapor Deposition (CVD). Thus, the diaphragm bumps 123e are formed below the dimples 110a. In addition, etching using a photoresist mask is performed on the lower conductive film 120 so as to form the diaphragm 123 and the guard 127 (both of which are formed using the lower conductive film 120).

Figure 6:
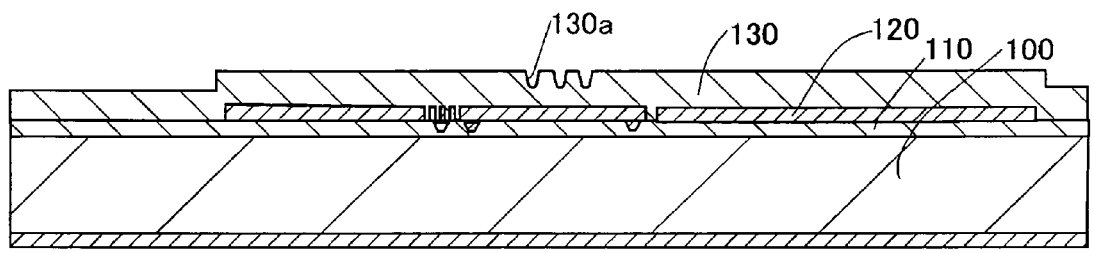
FIG. 6 is a sectional view used for explaining a second step of the manufacturing method of the condenser microphone.

In a second step of the manufacturing method shown in FIG. 6, the upper insulating film 130 which is a deposited film composed of silicon oxide is formed on the entire surfaces of the lower insulating film 110 and the lower conductive film 120. Dimples 130a used for the formation of the plate bumps 162f are formed in the upper insulating film 130 by way of etching using a photoresist mask.

Figure 7:
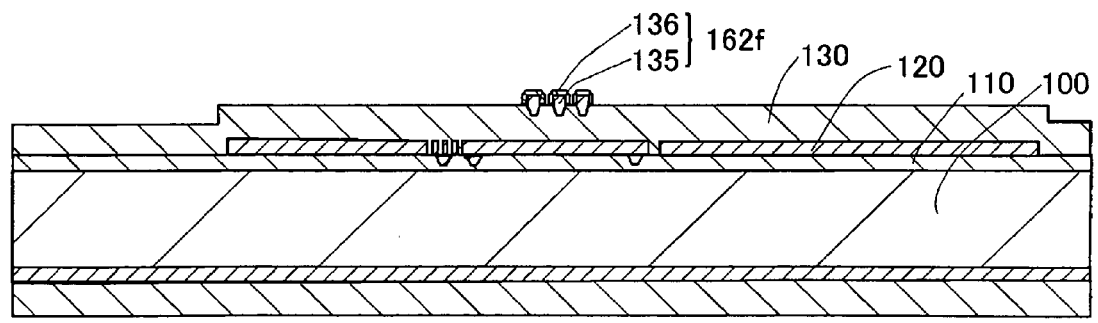
FIG. 7 is a sectional view used for explaining a third step of the manufacturing method of the condenser microphone.

In a third step of the manufacturing method shown in FIG. 7, the plate bumps 162f each of which is composed of the polycrystal silicon film 135 and the silicon nitride film 135 are formed on the surface of the upper insulating film 130. The silicon nitride film 136 prevents the diaphragm 123 from being brought into contact with and short-circuited to the plate 162.

Figure 8:
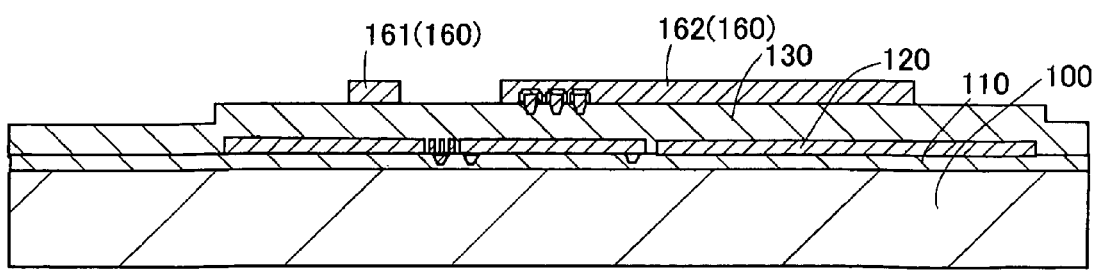
FIG. 8 is a sectional view used for explaining a fourth step of the manufacturing method of the condenser microphone.

In a fourth step of the manufacturing method shown in FIG. 8, the upper conductive film 160 which is a deposited film composed of polycrystal silicon is formed on the surface of the upper insulating film 130 and the surface of the silicon nitride film 136 by way of CVD. The upper conductive film 160 is etched using a photoresist mask so as to form the plate 162 and the etching stopper ring 161. In this step, the plate holes 162c are not formed in the plate 162.

Figure 9:
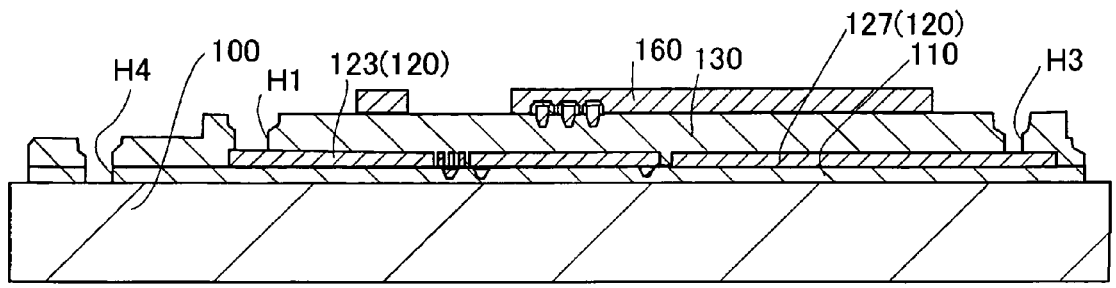
FIG. 9 is a sectional view used for explaining a fifth step of the manufacturing method of the condenser microphone.

In a fifth step of the manufacturing method shown in FIG. 9, through-holes H1, H3, and H4 (which correspond to the contact holes CH1, CH3, and CH4) are formed in the lower insulating film 110 and the upper insulating film 130 by way of anisotropic etching using a photoresist mask, thus partially exposing the diaphragm 123, the guard 127, and the substrate 100.

Figure 10:
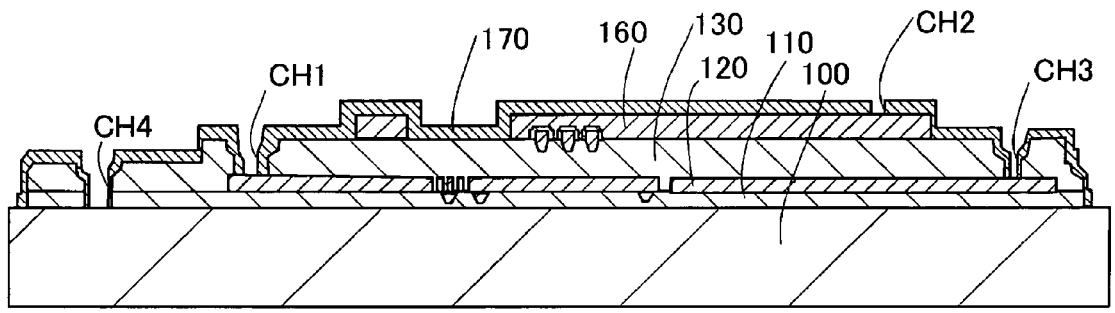
FIG. 10 is a sectional view used for explaining a sixth step of the manufacturing method of the condenser microphone.

In a sixth step of the manufacturing method shown in FIG. 10, the surface insulating film 170 composed of silicon oxide is formed on the entire surface by way of plasma CVD. Etching is performed using a photoresist mask so as to completely form the contact holes CH1, CH2, CH3, and CH4 in the surface insulating film 170. As a result, the diaphragm 123, the plate 162, the guard 127, and the substrate 100 are partially exposed.

Figure 11:
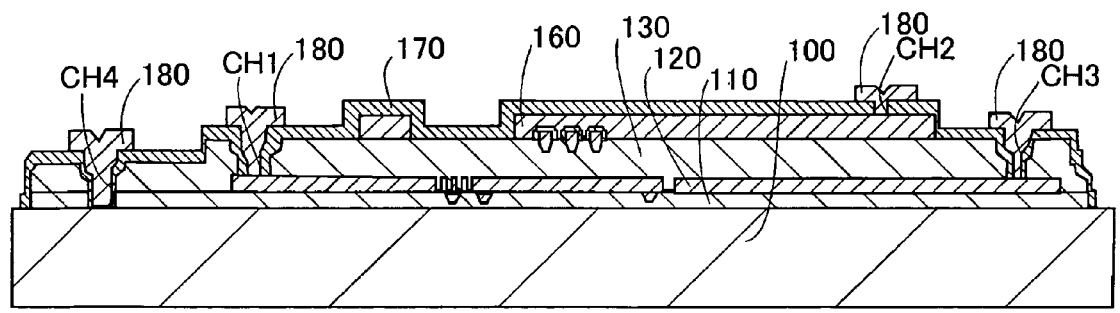
FIG. 11 is a sectional view used for explaining a seventh step of the manufacturing method of the condenser microphone.

In a seventh step of the manufacturing method shown in FIG. 11, a deposited film composed of AlSi is formed on the entire surface by way of sputtering so as to cover the contact holes CH1, CH2, CH3, and CH4, wherein it joins the diaphragm 123, the plate 162, the guard 127, and the substrate 100. Then, etching using a photoresist mask is performed to partially remove the deposited film of AlSi while leaving the prescribed portions of the deposited film covering the contact holes CH1, CH2, CH3, and CH4, by which the pad conductive films 180 are formed using the deposited film of AlSi. At this time, the deposited film of AlSi is subdivided into plural areas corresponding to the contact holes CH1, CH2, CH3, and CH4, thus defining the outlines of the pad conductive films 180, i.e. the side surfaces of the pad conductive films 180. The deposited film of AlSi is subjected to patterning by wet etching by use of a spin processor under prescribed conditions, for example, in which a mixed acid (e.g. a mixed acid of phosphoric acid, nitric acid, and water) is used as an etchant, a heating temperature is set to a range from 60° C. to 75° C. (preferably, it is set to 65° C.), and spinning is performed for a processing time ranging from 30 sec to 120 sec (preferably, a processing time of 60 sec) with a rotation speed ranging from 600 rpm to 1,000 rpm (preferable, a rotation speed of 800 rpm). In wet etching, the activated side surfaces may be exposed on the pad conductive films 180, which thus suffer from lower chemical stability and corrosion easily. In dry etching, the side surfaces of the pad conductive films 180 are exposed to chlorine gas used in etching so that the pad conductive films 180 suffer from low chemical stability and corrosion easily.

Figure 12:
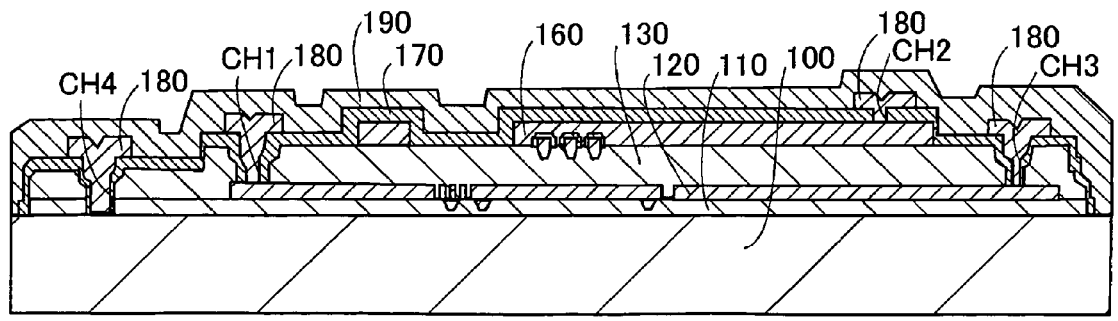
FIG. 12 is a sectional view used for explaining an eighth step of the manufacturing method of the condenser microphone.

To cope with the above drawback, in an eighth step of the manufacturing method shown in FIG. 12, the pad protective films 190 which are deposited films composed of silicon nitride and which are used to protect the side surfaces of the pad conductive films 180 are formed on the surface of the surface insulating film 170 and the surfaces of the pad conductive films 180 by way of low-stress plasma CVD under prescribed conditions at temperature of 400° C., pressure of 2.5 Torr, $SiH_4$ flow of 0.3 SLM, $NH_3$ flow of 1.75 SLM, bias power (RF H/F) of 0.44 kW/0.351 kW. Thus, the pad protective films 190 composed of silicon nitride are formed with the thickness of 1.6 μm by way of low-stress plasma CVD.

Figure 13A:
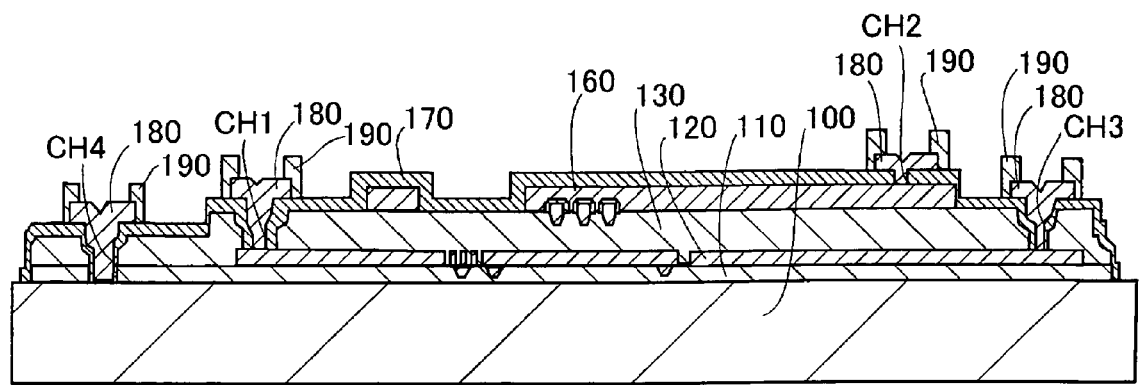
FIG. 13A is a sectional view used for explaining a ninth step of the manufacturing method of the condenser microphone.
Figure 13B:
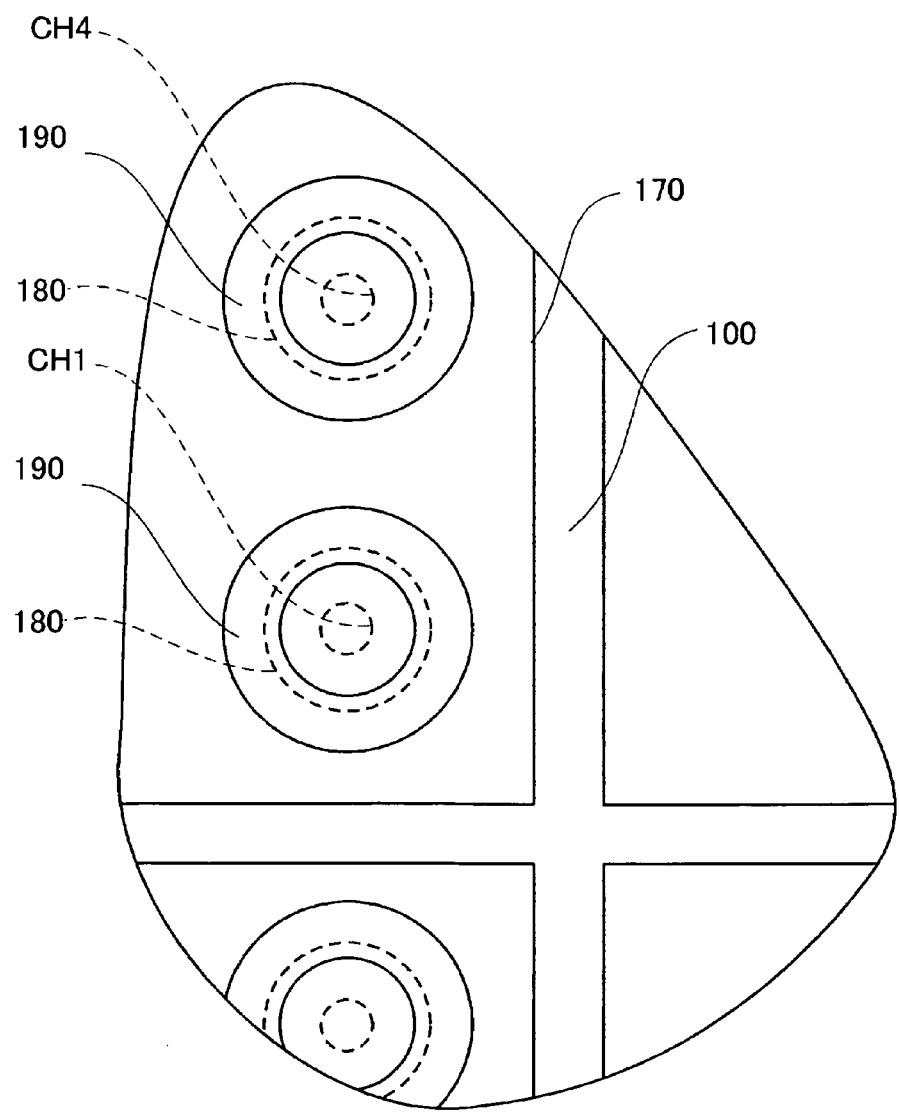
FIG. 13B is a plan view of FIG. 13A, which is used for explaining the relationship between pad protective films and pad conductive films formed on a surface insulating film.

In a ninth step of the manufacturing method shown in FIGS. 13A and 13B, dry etching is performed using a photoresist mask to partially remove the pad protective films 190 while leaving the peripheral portions surrounding the pad conductive films 180. As a result, the pad protective films 190, which are deposited films composed of silicon nitride having superior protection characteristics, are isolated from each other and are formed in connection with the contact holes CH1, CH2, CH3, and CH4. Specifically, the patterning of the pad protective films 190 is achieved by way of dry etching using a parallel-plate plasma etcher under prescribed conditions at CF4+O2 mixed gas flow of 150 SCCM, pressure ranging from 0.8 Torr to 1.2 Torr (preferably, pressure of 1.0 Torr), bias power of 250 W, and heating temperature of 80° C. for 130 seconds. In the present embodiment, the patterning is performed so as to localize the pad protective films 190 composed of silicon oxide; hence, it is possible to suppress the distortion of the sensor die 1 due to the stress of the pad protective films 190.

Figure 14:
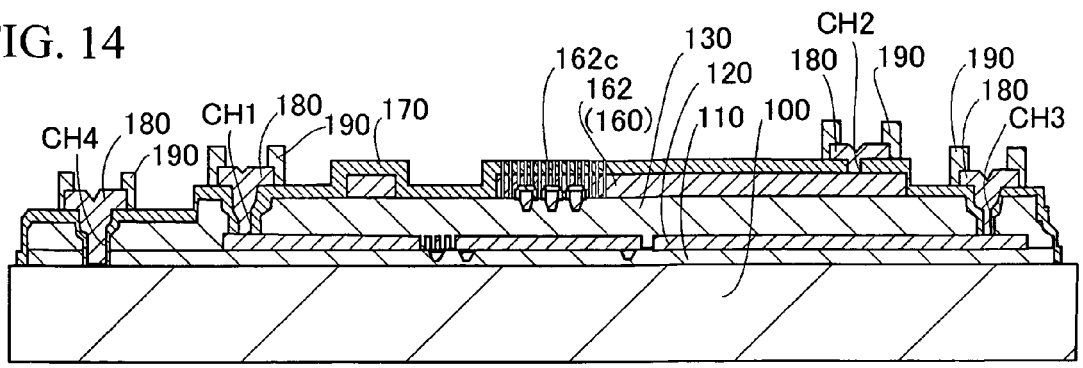
FIG. 14 is a sectional view used for explaining a tenth step of the manufacturing method of the condenser microphone.

In an tenth step of the manufacturing method shown in FIG. 14, anisotropic etching is performed using a photoresist mask so as to form through-holes corresponding to the plate holes 162c in the surface insulating film 170, whereby the plate holes 162c are formed in the upper conductive film 160. This step is consecutively executed by using the surface insulating film 170 having through-holes as a mask for use in etching of the upper conductive film 160.

Figure 15:
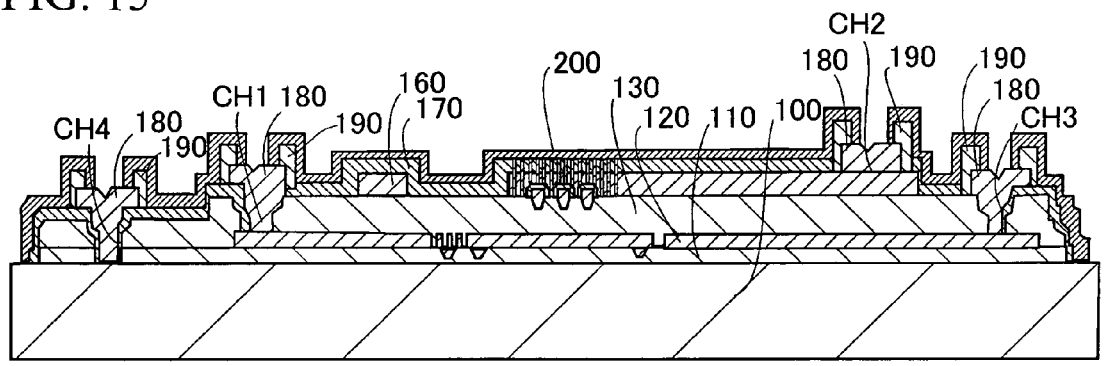
FIG. 15 is a sectional view used for explaining an eleventh step of the manufacturing method of the condenser microphone.

In an eleventh step of the manufacturing method shown in FIG. 15, the plating protective film 200 composed of silicon oxide is formed on the surface of the surface insulating film 170, the surfaces of the pad conductive films 180, and the surfaces of the pad protective films 190. The plating protective film 200 is patterned by etching using a photoresist mask so as to expose the center areas of the surfaces of the pad conductive films 180 covering the contact holes CH1, CH2, CH3, and CH4.

Figure 16:
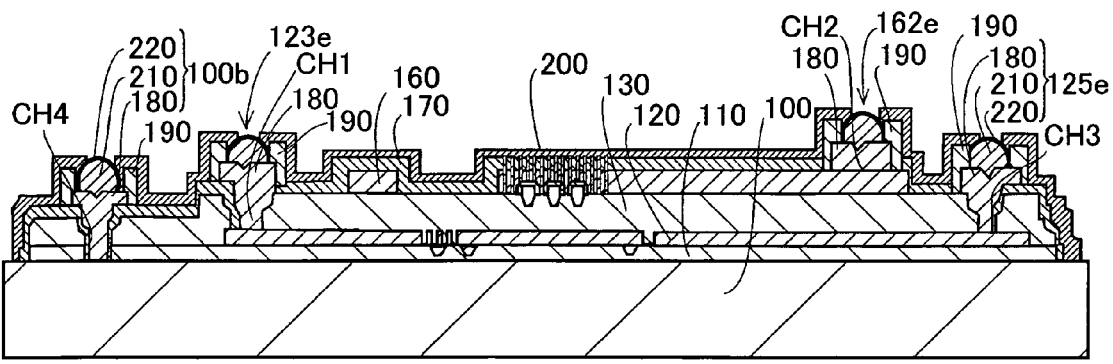
FIG. 16 is a sectional view used for explaining a twelfth step of the manufacturing method of the condenser microphone.

In a twelfth step of the manufacturing method shown in FIG. 16, the bump films 210 composed of nickel are formed on the exposed surfaces of the pad conductive films 180, which are exposed in the through-holes of the plating protective film 200 by way of electroless plating. The bump protective films 220 composed of Au are formed on the surfaces of the bump films 210. Then, the backside of the substrate 100 is polished so as to achieve the prescribed thickness of an actual product.

Figure 17:
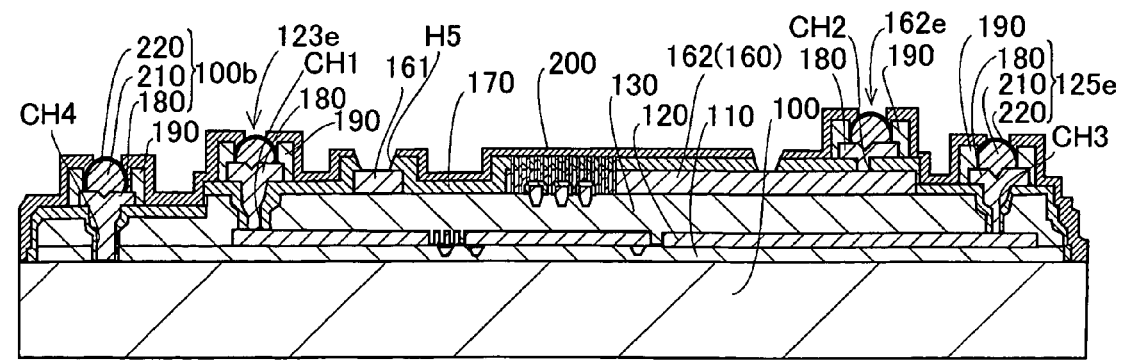
FIG. 17 is a sectional view used for explaining a thirteenth step of the manufacturing method of the condenser microphone.

In a thirteenth step of the manufacturing method shown in FIG. 17, etching is performed using a photoresist mask so as to form a ring-shaped channel H5, which exposes the etching stopper ring 161 in connection with the plating protective film 200 and the surface insulating film 170.

Figure 18:
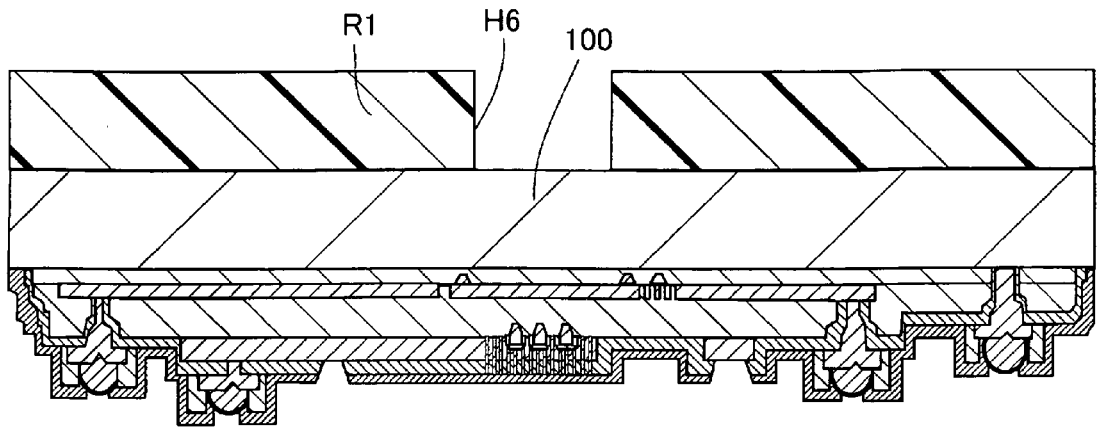
FIG. 18 is a sectional view used for explaining a fourteenth step of the manufacturing method of the condenser microphone.

In a fourteenth step of the manufacturing method shown in FIG. 18, a photoresist mask R1 having a through-hole H6 (used for the formation of the back cavity C1 of the substrate 100) is formed on the backside of the substrate 100.

Figure 19:
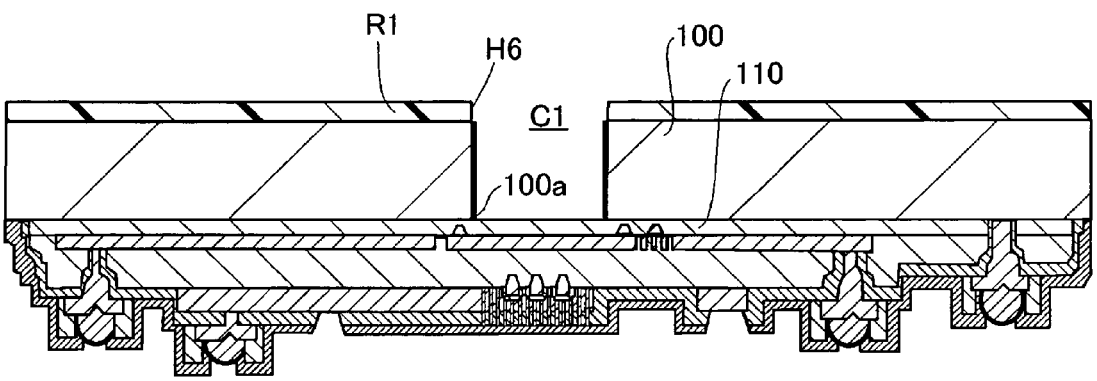
FIG. 19 is a sectional view used for explaining a fifteenth step of the manufacturing method of the condenser microphone.

In a fifteenth step of the manufacturing method shown in FIG. 19, the through-hole corresponding to the back cavity C1 is formed in the substrate 100 by way of Deep Reactive Ion Etching (Deep-RIE), wherein the lower insulating film 110 serves as an etching stopper.

Figure 20:
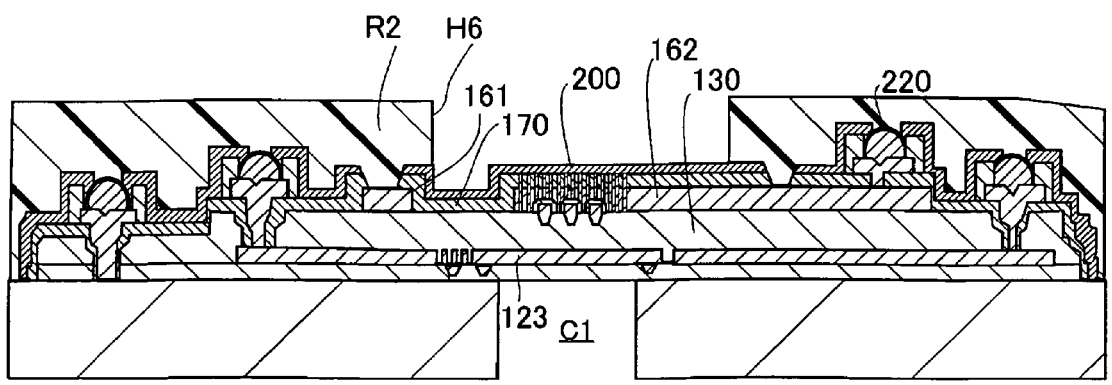
FIG. 20 is a sectional view used for explaining a sixteenth step of the manufacturing method of the condenser microphone.
Figure 21:
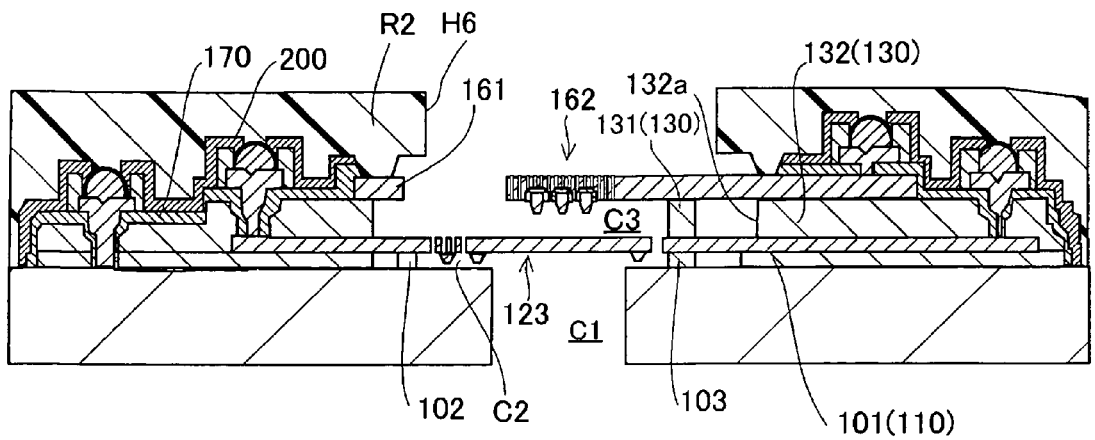
FIG. 21 is a sectional view used for explaining a seventeenth step of the manufacturing method of the condenser microphone.

In sixteenth and seventeenth steps of the manufacturing method shown in FIGS. 20 and 21, isotropic etching is performed using a photoresist mask R2 and buffered hydrofluoric acid (BHF) so as to remove the plating protective film 200 and the surface insulating film 170 exposed in the through-hole H6 of the photoresist mask R2 while further removing a part of the upper insulating film 130 so as to form the ring-shaped portion 132, the plate spacers 131, and the gap layer C3. In addition, a part of the lower insulating film 110 is removed from the back cavity C1 so as to form the guard insulators 103, the diaphragm spacers 102, the ring-shaped portion 101, and the gap layer C2. At this time, an etchant (i.e. BHF) enters into the through-hole H6 of the photoresist mask R2 and the opening 100a of the substrate 100. The outline of the upper insulating film 130 is defined by the plate 162. That is, the ring-shaped portion 132 and the plate spacers 131 are formed by way of self-alignment of the plate 162. The outline of the lower insulating film 110 is defined by the opening 100a of the substrate 100, the diaphragm 123, the guard electrodes 125a, the guard connectors 125b, and the guard ring 125c, wherein the guard insulators 103 and the diaphragm spacers 102 are formed by way of self-alignment.

Lastly, the photoresist mask R2 is removed; then, the substrate 100 is subjected to dicing, thus completing production of the sensor die 1 shown in FIG. 2 for use in a condenser microphone. The sensor die 1 is attached to a package substrate (not shown) together with the circuit die; the terminals 125e, 162e, 123e, and 100b of the sensor die 1 are electrically connected to respective terminals (not shown) of the circuit die; then, a package cover (not shown) is placed on the package substrate, thus completely forming the condenser microphone. When the sensor die 1 is attached to the package substrate, the opening of the back cavity C1 in the backside of the substrate 100 is closed by the package substrate.

(4) Variations

The present embodiment can be modified in a variety of ways; hence, variations will be described with reference to FIGS. 22 to 25.

Figure 22:
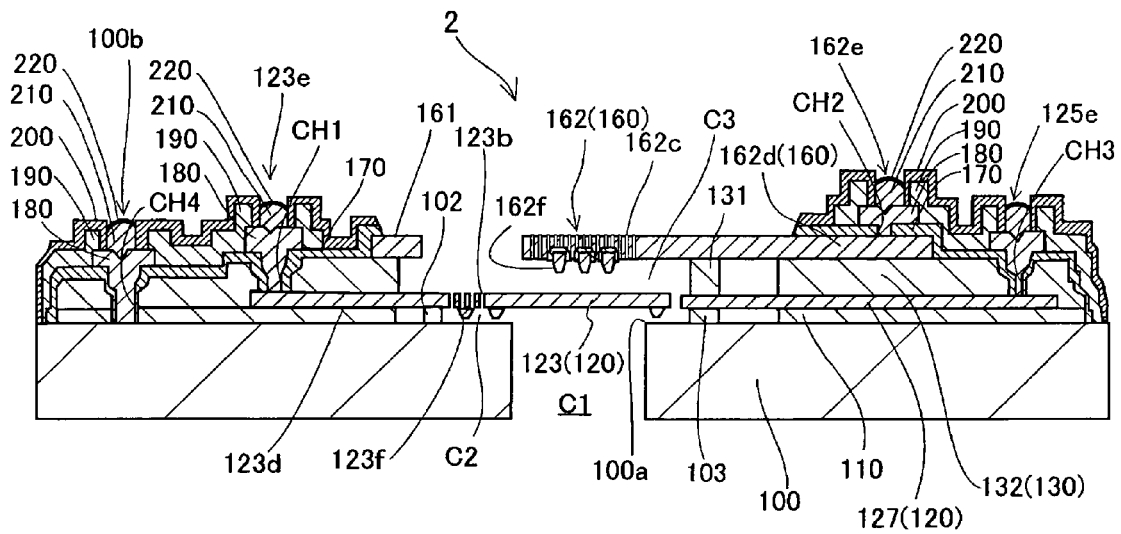
FIG. 22 is a sectional view of a sensor die according to a first variation of the first embodiment.

FIGS. 22, 23, 24, and 25 show sensor dies 2, 3, 4, and 5 each for use in a condenser microphone, wherein parts identical to those of the sensor die 1 shown in FIG. 2 are designated by the same reference numerals. As shown in FIG. 22, it is possible to cover the peripheral portion of the substrate 100 and the peripheral portion of the surface insulating film 170 with the pad protective films 190, whereby the edges of the joint surface between the substrate 100 (composed of monocrystal silicon) and the surface insulating film 170 (composed of silicon oxide) are covered with the pad protective films 190 which is composed of silicon nitride or silicon nitride oxide, the protective function of which is higher than that of the plating protective film 200. This reliably prevents movable ions from entering into the edges of the joint surface between the substrate 100 composed of monocrystal silicon and the surface insulating film 170 composed of silicon oxide.

Figure 23:
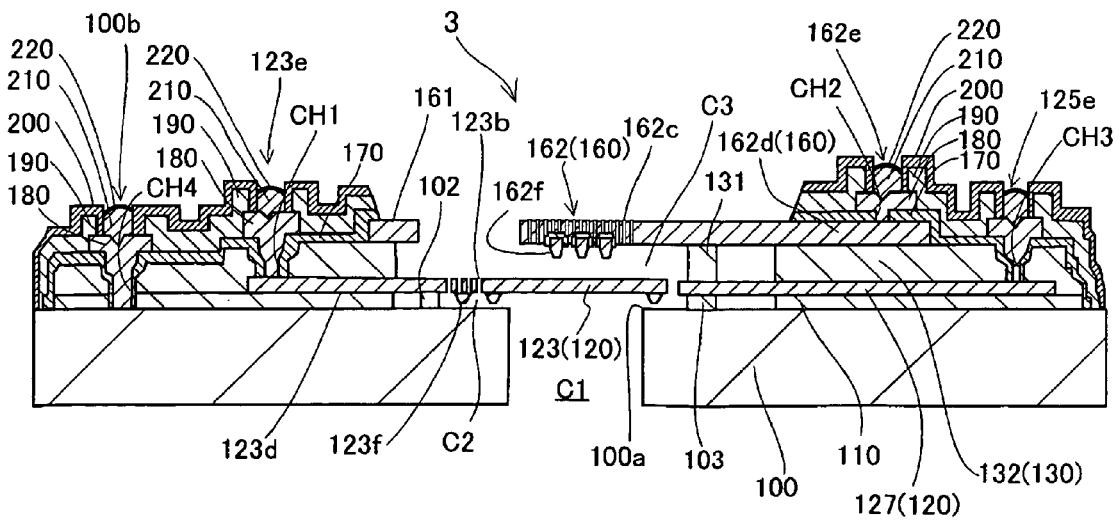
FIG. 23 is a sectional view of a sensor die according to a second variation of the first embodiment.
Figure 24:
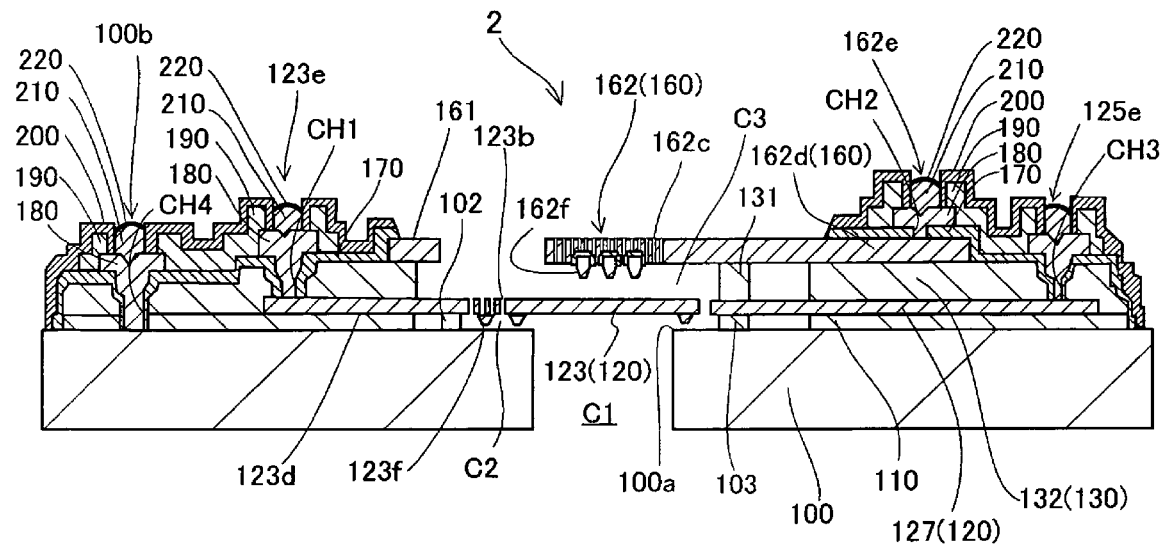
FIG. 24 is a sectional view of a sensor die according to a third variation of the first embodiment.
Figure 25:
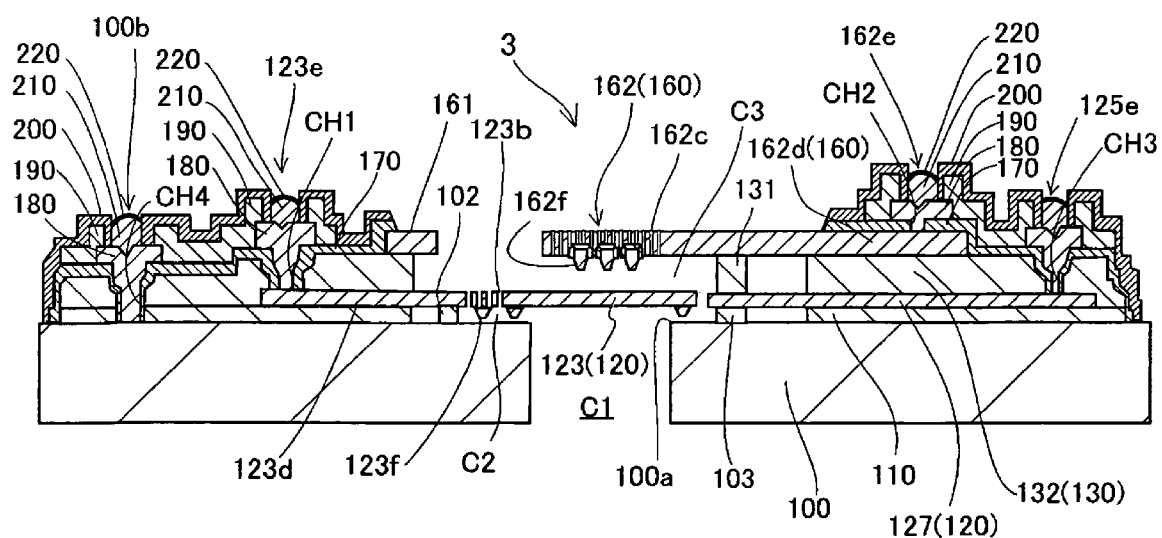
FIG. 25 is a sectional view of a sensor die according to a fourth variation of the first embodiment.

In the above, it is preferable that the pad protective films 190 be formed in narrow regions as possible as long as they cover the side surfaces of the pad conductive films 180 serving as electrode films. In this sense, it is possible to integrally unify the pad protective films 190 with respect to the combination of the adjacent terminals 123e and 100b and the combination of the adjacent terminals 125e and 162e as shown in FIGS. 22 to 25. Alternatively, it is possible to unify the pad protective films 190 so as to integrally cover all the terminals 125e, 162e, 123e, and 100b. Alternatively, it is possible to extend the pad protective film 190 above or in proximity to the etching stopper ring 161 as shown in FIG. 23, wherein the pad protective film 190 is formed on the entire surface externally of the interior wall 132a of the ring-shaped portion 132 forming the support structure. In this connection, the pad protective films 190 can be each formed in a circular shape or a polygonal ring shape.

2. Second Embodiment

A sensor chip 10 of a condenser microphone according to a second embodiment of the present invention will be described with reference to FIGS. 26 to 28, FIGS. 29A and 29B, and FIGS. 30 to 48, wherein parts identical to those of the sensor die 1 of the condenser microphone shown in FIGS. 1 to 3, FIGS. 4A to 4D, FIGS. 5 to 12, FIGS. 13A and 13B, and FIGS. 14 to 25 are designated by the same reference numerals; hence, duplicate descriptions thereof are simplified as necessary.

(1) Constitution

Figure 26:
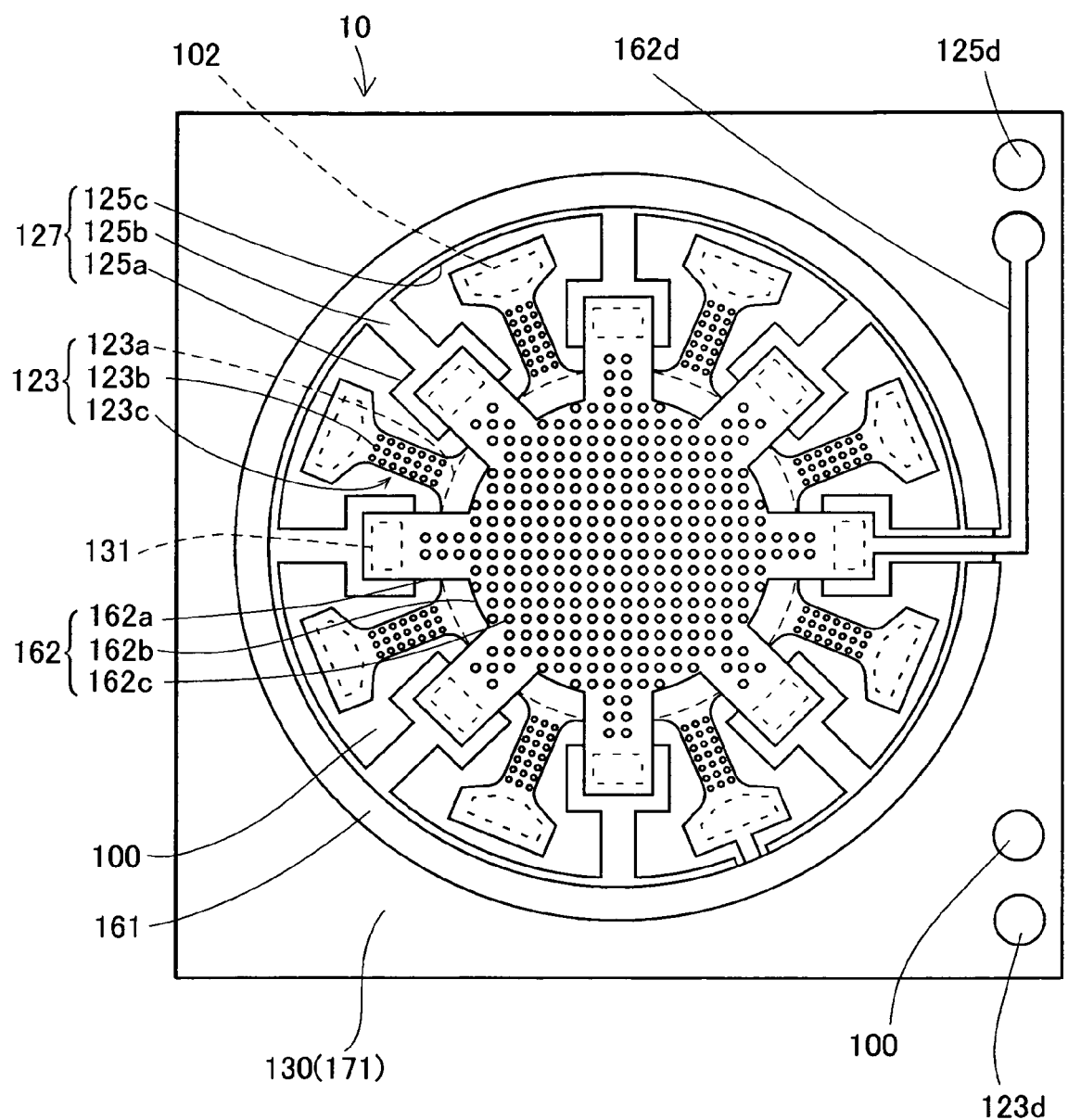
FIG. 26 is a plan view showing a sensor chip of a condenser microphone in accordance with a second embodiment of the present invention.
Figure 27:
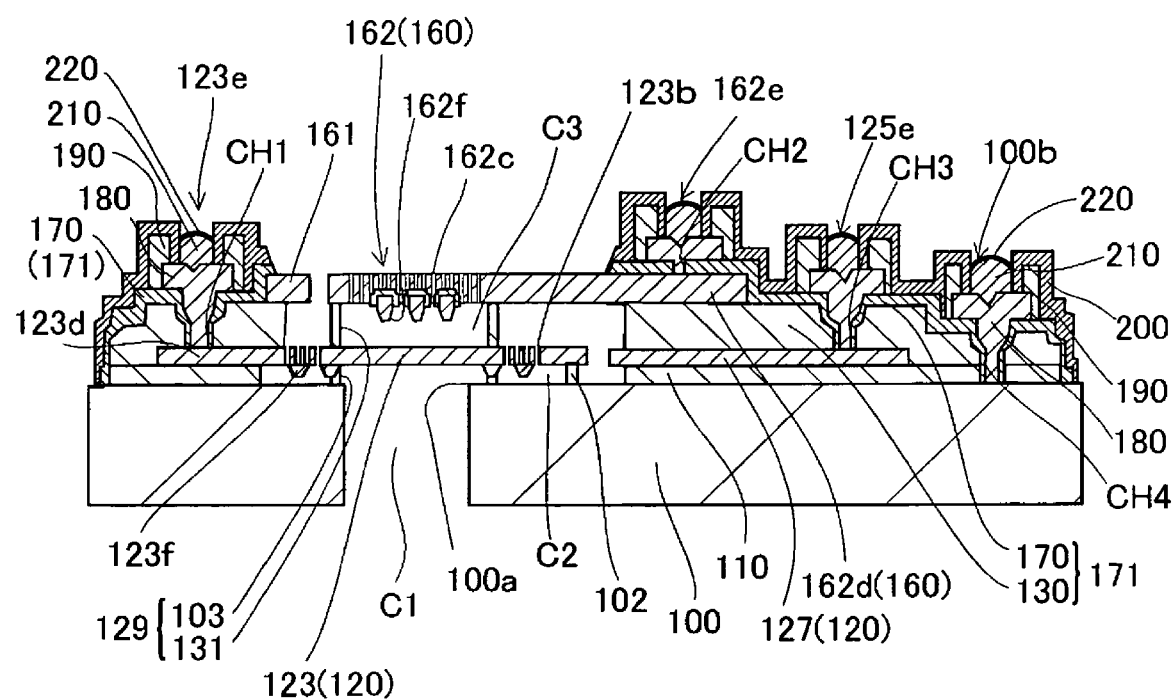
FIG. 27 is a sectional view showing the constitution of the sensor chip.
Figure 28:
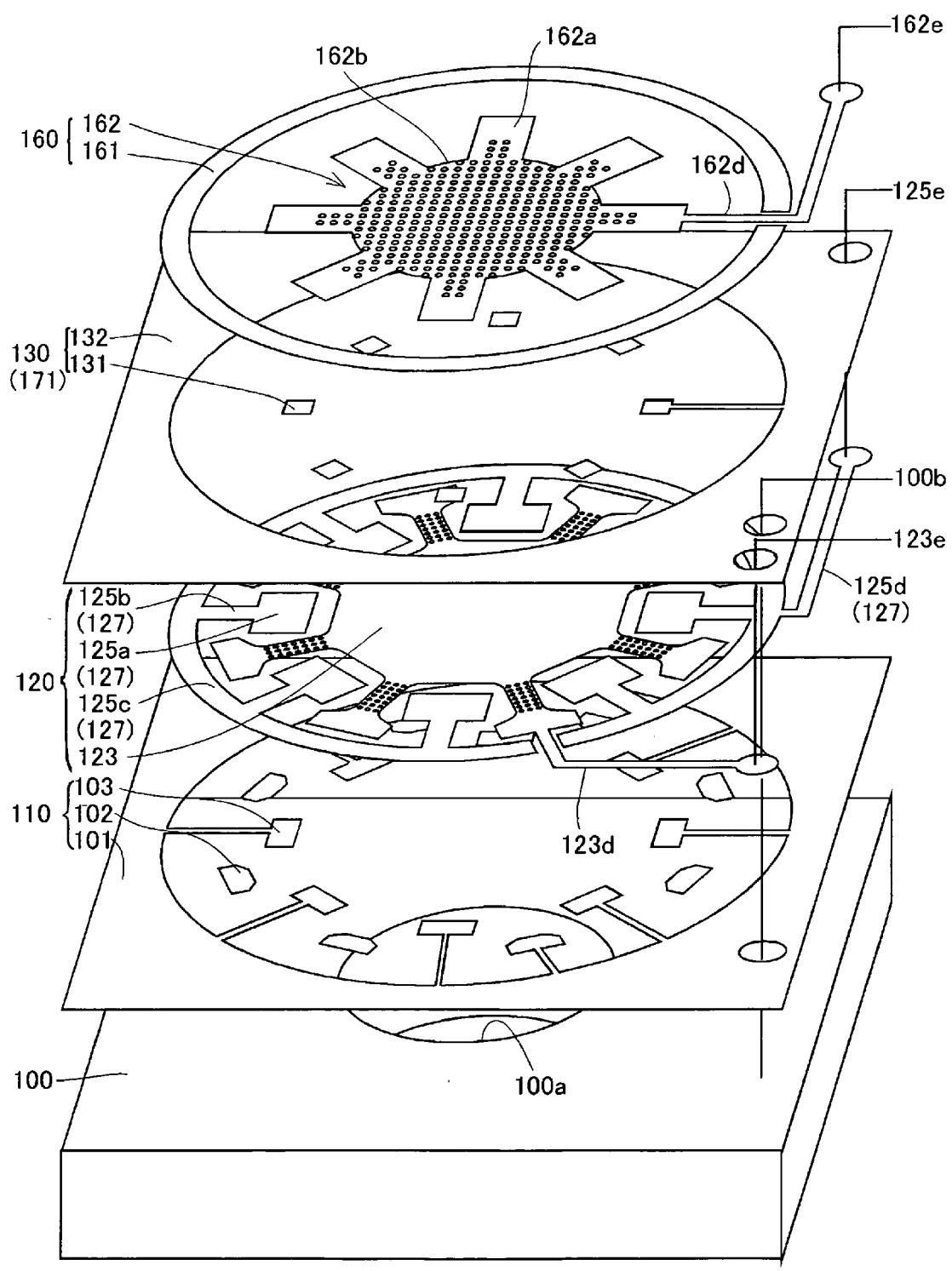
FIG. 28 is an exploded perspective view showing the film-laminating structure of the sensor chip.

FIG. 26 shows the constitution of the sensor chip 10, which is an MEMS structure of the condenser microphone according to the second embodiment of the present invention; FIG. 27 is a sectional view of the sensor chip 10; and FIG. 28 is an exploded perspective view showing the film-laminating structure in the sensor chip 10. The condenser microphone (serving as an MEMS transducer) is constituted of the sensor chip 10, a circuit chip (including a power circuit and an amplifier, not shown), and a package (not shown).

First, the film-laminating structure of an MEMS structure of the sensor chip 10 will be described below.

The sensor chip 10 is constituted of the lower insulating film 110, the lower conductive film 120, the upper insulating film 130, the upper conductive film 160, and the surface insulating film 170, all of which are laminated and deposited on the substrate 100.

The opening 100a of the through-hole of the substrate 100 composed of P-type monocrystal silicon forms the opening of the cavity C1.

The insulating member 171 is constituted of the surface insulating film 170 and the upper insulating film 130 (which insulates the upper conductive film 160 from the lower conductive film 120).

The lower insulating film 110, which joins the substrate 100, the lower conductive film 120, and the upper insulating film 130, is composed of silicon oxide (SiOx). The lower insulating film 110 is used to form the diaphragm spacers 102 which are circumferentially aligned with equal spacing therebetween, the guard spacers (or guard insulators) 103 which are circumferentially aligned with equal spacing therebetween inwardly of the diaphragm spacers 102, and the ring-shaped portion 101 which insulates the guard ring 125c and the guard lead 125d from the substrate 100.

The lower conductive film 120 joining the lower insulating film 110 and the upper insulating film 130 is composed of polycrystal silicon entirely doped with impurities such as phosphorus (P). The lower conductive film 120 is used to form the diaphragm 123 and the guard 127 including the guard electrodes 125a, the guard connectors 125b, the guard ring 125c, and the guard lead 125d.

The upper insulating film 130 joining the lower conductive film 120, the upper conductive film 160, and the lower insulating film 110 is composed of silicon oxide so as to form a part of the insulating member 171. The upper insulating film 130 is used to form the plate spacers 131, which are circumferentially aligned with equal spacing therebetween, and the ring-shaped portion 132, which is positioned externally of the plate spacers 131 and which supports the etching stopper ring 161 while insulating the plate lead 162d from the guard lead 125d.

The upper conductive film 160 joining the upper insulating film 130 is composed of polycrystal silicon entirely doped with impurities such as phosphorus (P). The upper conductive film 160 is used to form the plate 162, the plate lead 162d, and the etching stopper ring 161.

The surface insulating film 170 joining the upper conductive film 160 and the upper insulating film 130 is composed of silicon oxide so as to form a part of the insulating member 171.

The MEMS structure of the sensor chip 10 has the four terminals 125e, 162e, 123e, and 100b, all of which are formed using the pad conductive films 180 (composed of metals), the bump films 210, and the bump protective films 220. The pad conductive films 180 are composed of aluminum, wherein it may contain silicon at 1% in order to prevent silicon from being diffused from the upper conductive film 160 to the pad conductive films 180. The pad conductive films 180 cover the contact holes CH1, CH2, CH3, and CH4 (which are formed in the upper conductive film 160 and the surface insulating film 170), wherein the peripheries and side surfaces thereof are covered with the pad protective films 190 composed of silicon nitride. The pad protective films 190 are formed only in the surrounding areas of the pad conductive films 180 on the surface of the surface insulating film 170 (which forms the surface of the insulating member 171). That is, the pad protective films 190 are formed in the limited areas, i.e. the surfaces of the pad conductive films 180 except for center portions and the surrounding areas of the pad conductive films 180 on the surface of the insulating member 171, thus covering the "activated" side surfaces of the pad conductive films 180. The pad protective films 190 are isolated from each other in connection with the terminals 125e, 162e, 123e, and 100b, wherein they cover the limited area of the MEMS structure of the sensor chip 10 but does not cover the movable portions of the pad protective films 190. For this reason, even though the pad protective films 190 are composed of silicon nitride causing a relatively high membrane stress, it is possible to prevent the pad protective films 190 from damaging the mechanical function of the MEMS structure of the sensor chip 10. The bump films 210 having conductivity composed of Ni are formed on the center portions of the surfaces of the pad conductive films 180 which are not covered with the pad protective films 190. In short, the pad protective films 190 are formed on the surfaces of the pad conductive films 180 except for bump forming regions. The surfaces of the bump films 210 are covered with the bump protective films 220 composed of Au having conductivity and relatively high corrosion resistance. The side surfaces of the pad conductive films 180 which are activated due to patterning are adequately protected by the pad protective films 190 composed of silicon nitride. It is possible to bond wires to the pad conductive films 180. In this connection, the pad protective films 190 can be composed of silicon nitride oxide, for example.

Next, the mechanical structure of the MEMS structure of the sensor chip 10 will be described below.

The diaphragm 123 is a single layer having conductivity in the entirety, i.e. a thin silicon film, wherein it is constituted of the center portion 123a and the arms 123c. The diaphragm 123 is supported between the substrate 100 and the plate 162 with prescribed gaps therebetween by means of the diaphragm spacers 102 having pillar shapes which join the distal ends of the arms 123c, wherein the diaphragm 123 is positioned in parallel with the surface of the substrate 100 while being insulated from the plate 162. The diaphragm 123 is reduced in rigidity due to the cutouts formed between the adjacent arms 123c in comparison with the foregoing diaphragm having no arm and no cutout. A plurality of diaphragm holes 123b is formed in each of the arms 123c, which are thus reduced in rigidity.

The diaphragm spacers 102 are circumferentially aligned with equal spacing therebetween in the surrounding area of the opening 100a of the back cavity C1. The diaphragm spacers 102 are insulating deposited films having pillar shapes. The diaphragm 123 is supported above the substrate 100 via the diaphragm supports 102 such that the center portion 123a covers the opening 100a of the back cavity C1. The gap layer C2 whose height substantially matches the thickness of the diaphragm spacers 102 is formed between the substrate 100 and the diaphragm 123, thus establishing a balance between the internal pressure of the back cavity C1 and the atmospheric pressure. The gap layer C2 has a small width and a long length elongated in the radial direction of the diaphragm 123 so as to form the maximum acoustic resistance in the path for propagating sound waves (for vibrating the diaphragm 123) toward the opening 100a of the back cavity C1.

A plurality of diaphragm bumps 123f is formed on the backside of the diaphragm 123 positioned opposite to the surface of the substrate 100. The diaphragm bumps 123f are projections for preventing the diaphragm 123 from being fixed to the substrate 100, wherein they are formed using the waviness of the lower conductive film 120 forming the diaphragm 123.

The diaphragm 123 is connected to the diaphragm terminal 123e via the diaphragm lead 123d which is elongated from the distal end of the prescribed arm 123c so as to join the pad conductive film 180 applied to the diaphragm terminal 123e. The width of the diaphragm lead 123d is smaller than the width of the arm 123c and is formed using the lower conductive film 120 which is also used to form the diaphragm 123.

Figure 29A:
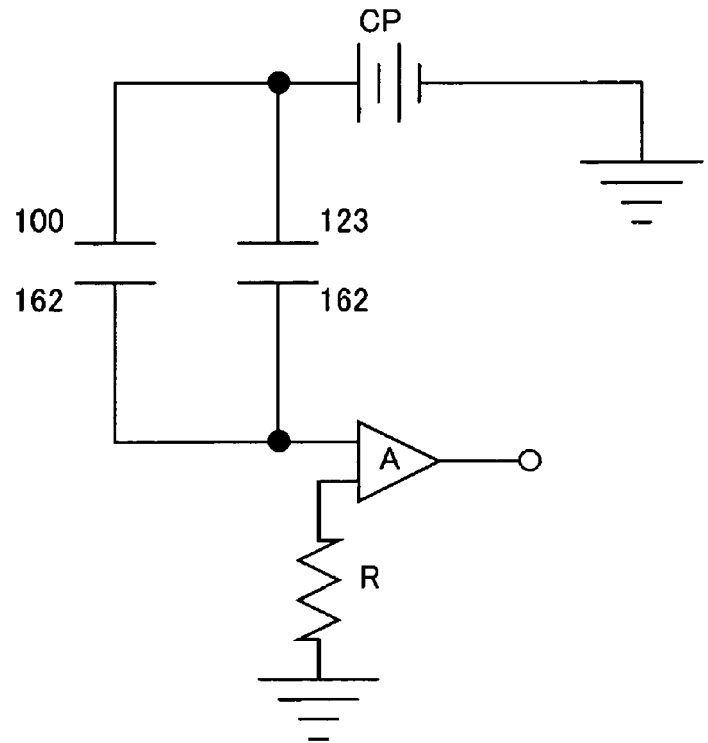
FIG. 29A is a circuit diagram showing an equivalent circuit of the sensor chip connected to the circuit chip.
Figure 29B:
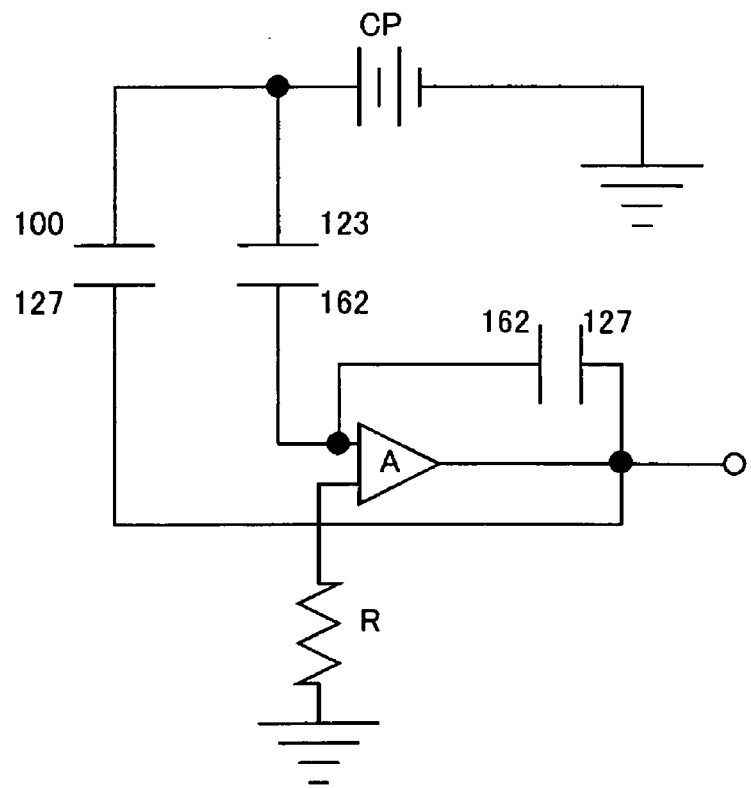
FIG. 29B is a circuit diagram showing an equivalent circuit of the sensor chip including a guard and connected to the circuit chip.

The diaphragm lead 123d is extended toward the diaphragm terminal 123e via the slit of the guard ring 125c. Since the diaphragm terminal 123e and the substrate terminal 100b are short-circuited to the circuit chip (not shown) as shown in FIGS. 29A and 29B, both the diaphragm 123 and the substrate 100 are set to the same potential.

When the potential of the diaphragm 123 differs from the potential of the substrate 100, a parasitic capacitance occurs between the diaphragm 123 and the substrate 100. However, since the diaphragm 123 is supported by the diaphragm spacers 102 having air layers therebetween, it is possible to reduce the parasitic capacitance in comparison with the foregoing structure in which the diaphragm is supported by the spacer having a ring-shaped wall structure.

The plate 162 is a single thin film having conductivity in the entirety, wherein it is constituted of the center portion 162b and the arms 162a. The plate 162 is supported by the plate spacers 162 having pillar shapes which join the distal ends of the arms 162a. The plate 162 is positioned in parallel with the diaphragm 123 such that the center of the plate 162 overlaps the center of the diaphragm 123 in plan view. The shortest distance between the center to the periphery of the plate 162 is shorter than the shortest distance between the center to the periphery of the diaphragm 123; hence, the plate 162 does not face the periphery of the diaphragm 123 (whose amplitude of vibration is very small). The cutouts formed between the adjacent arms 162a of the plate 162 are positioned in proximity to but do not face the periphery of the diaphragm 123 in plan view, wherein the arms 123c are extended in the cutouts of the arms 162a in plan view. This increases the length of the diaphragm 123 (i.e. the distance between both ends of the diaphragm 123 causing vibration) without increasing the parasitic capacitance between the diaphragm 123 and the plate 162.

A plurality of plate holes 162c is formed in the plate 162, wherein it collectively functions as a passage for propagating sound waves to the diaphragm 123, and it also collectively functions as a through-hole for transmitting an etchant (used for isotropic etching of the upper insulating film 130) therethrough. The remaining portion of the upper insulating film 130 after etching is used to form the plate spacers 131 and the ring-shaped portion 132, while the removed portion thereof forms the gap layer C3 between the diaphragm 123 and the plate 162. The plate holes 162c are aligned in consideration of the height of the gap layer C3, the shapes of the plate holes 131, and the etching speed. As the distance between the adjacent plate holes 162c becomes smaller, the width of the ring-shaped portion 132 of the upper insulating film 130 becomes correspondingly smaller, thus reducing the overall chip area. However, the rigidity of the plate 162 becomes lower as the distance between the adjacent plate holes 162c becomes smaller.

The plate spacers 131 join the guard electrodes 125a which are positioned in the same layer as the diaphragm 123, wherein the guard electrodes 125a are formed using the lower conductive film 120 which is also used to form the diaphragm 123. The plate spacers 131 are formed using the upper insulating film 130 which is an insulating deposited film joining the plate 162. The plate spacers 131 are circumferentially aligned in the surrounding area of the opening 100a of the back cavity C1. Since the plate spacers 131 are positioned in the cutouts between the arms 123c of the diaphragm 123, it is possible to reduce the maximum diameter of the plate 162 to be smaller than the maximum diameter of the diaphragm 123. This reduces the parasitic capacitance between the plate 162 and the substrate 100 while increasing the rigidity of the plate 162.

The plate 162 is supported above the substrate 100 via a plurality of spacers 129 having pillar shapes which are constituted of the guard spacers 103, the guard electrodes 125a, and the plate spacers 131. The spacers 129 form the gap layer C3 between the plate 162 and the diaphragm 123, so that the gap layers C2 and C3 are formed between the plate 162 and the substrate 100. Since both the guard spacers 103 and the plate spacers 131 have insulating properties, the plate 162 is insulated from the substrate 100.

When the potential of the plate 162 differs from the potential of the substrate 100 without the intervention of the guard electrodes 125a, a parasitic capacitance occurs between the plate 162 and the substrate 100. This parasitic capacitance is increased by an insulator inserted between the plate 162 and the substrate 100 (see FIG. 29A). The second embodiment is designed such that the plate 162 is supported above the substrate 100 via the spacers 129 having pillar shapes which are constituted of the guard spacers 103, the guard electrodes 125a, and the plate spacers 131 and which are distanced from each other; hence, it is possible to reduce the parasitic capacitance in the MEMS structure having no guard electrode 125a in comparison with the foregoing structure in which the plate is supported above the substrate via an insulator having a ring-shaped wall structure.

A plurality of plate bumps 162f is formed on the backside of the plate 162 positioned opposite to the surface of the diaphragm 123. Each of the plate bumps 162f is formed using a silicon nitride (SiN) film (which joins the upper conductive film 160 forming the plate 162) and a polycrystal silicon film (which joins the silicon nitride film). The plate bumps 162f prevent the plate 162 from being fixed to the diaphragm 123.

The plate lead 162d whose width is smaller than the width of the arm 162a is extended from the distal end of the prescribed arm 162a of the plate 162 to the pate terminal 162e, so that it joins the pad conductive film 180 applied to the plate terminal 162e. The plate lead 162d is formed using the upper conductive film 160 (which is also used to form the plate 162), wherein the wiring path of the plate lead 162d overlaps the wiring path of the guard lead 125d in plan view. This reduces the parasitic capacitance between the plate lead 162d and the substrate 100.

(2) Operation

Next, the operation of the sensor chip 10 will be described with reference to FIGS. 29A and 29B, each of which shows the circuitry for connecting the sensor chip 10 to the circuit chip. A charge pump CP of the circuit chip applies a stabilized bias voltage to the diaphragm 123. As the bias voltage becomes higher, the sensitivity of the condenser microphone becomes correspondingly higher while the diaphragm 123 may be easily fixed to the plate 162, wherein the rigidity of the plate 162 is an important factor in the design of the condenser microphone.

Sound waves (which enter into the through-hole of a package, not shown) are propagated through the plate holes 162c and the cutouts between the arms 162a of the plate 162 so as to reach the diaphragm 123. Since sound waves having the same phase are propagated along the surface and the backside of the plate 162, the plate 162 does not vibrate substantially. Sound waves reaching the diaphragm 123 cause vibration relative to the plate 162. When the diaphragm 123 vibrates due to sound waves, the electrostatic capacitance of a parallel-plate condenser whose opposite electrodes correspond to the plate 162 and the diaphragm 123 is varied; then, electric signals corresponding to variations of electrostatic capacitance are output from the sensor chip 10 as voltage differences occurring between the diaphragm terminal 123e and the plate terminal 162e. An amplifier A of the circuit chip amplifies electric signals representing voltages. That is, electric signals corresponding to variations of electrostatic capacitance between the plate 162 and the diaphragm 123 are output via the pad conductive films 180 applied to the diaphragm terminal 123e and the plate terminal 162e. Since an output signal of the sensor chip 10 has a high impedance, it is necessary to incorporate the amplifier A inside the package.

The circuit elements such as the charge pump P and the amplifier A can be incorporated into the sensor chip 10, thus making the condenser microphone have a single-chip structure.

(3) Manufacturing Method

Next, a manufacturing method of the sensor chip 10 of the condenser microphone will be described with reference to FIGS. 30 to 46.

Figure 30:
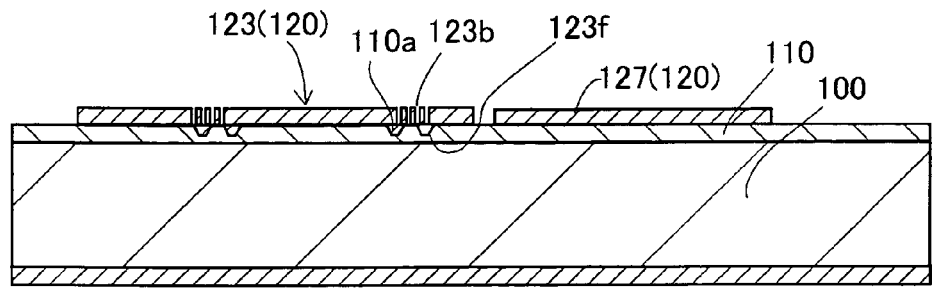
FIG. 30 is a sectional view used for explaining a first step of a manufacturing method of the sensor chip of the condenser microphone.

In a first step of the manufacturing method shown in FIG. 30, the lower conductive film 110 composed of silicon oxide is formed on the entire surface of the substrate 100. The dimples 110a used for the formation of the diaphragm bumps 123f are formed in the lower conductive film 110 by way of etching using a photoresist mask. The lower conductive film 120 composed of polycrystal silicon is formed on the surface of the lower insulating film 110 by way of Chemical Vapor Deposition (CVD), whereby the diaphragm bumps 123f are formed below the dimples 110a. Thereafter, the lower conductive film 120 is etched using a photoresist mask so as to form the diaphragm 123 and the guard 127.

Figure 31:
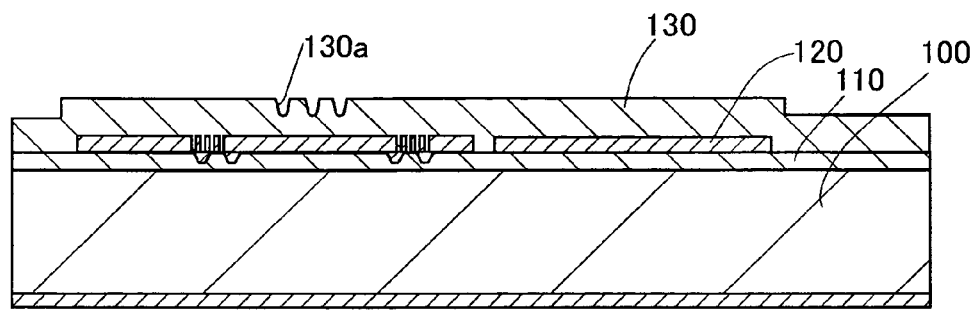
FIG. 31 is a sectional view used for explaining a second step of the manufacturing method of the sensor chip of the condenser microphone.

In a second step of the manufacturing method shown in FIG. 31, the upper insulating film 130 composed of silicon oxide is formed on the entire surface of the lower insulating film 110 and the lower conductive film 120. The dimples 130a used for the formation of the plate bumps 162f are formed in the upper insulating film 130 by way of etching using a photoresist mask.

Figure 32:
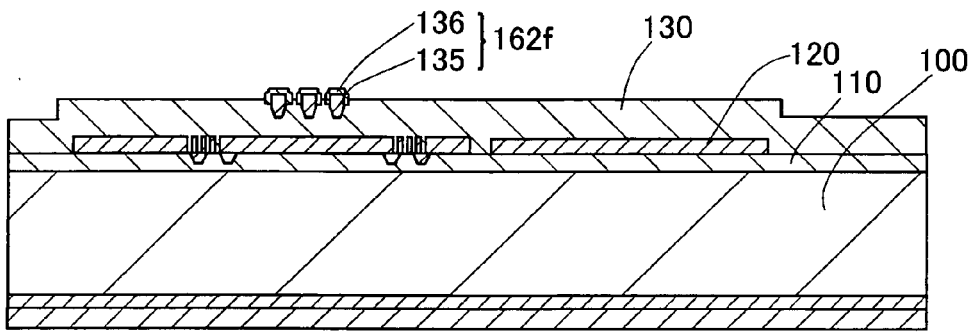
FIG. 32 is a sectional view used for explaining a third step of the manufacturing method of the sensor chip of the condenser microphone.

In a third step of the manufacturing method shown in FIG. 32, the plate bumps 162f are formed on the surface of the upper insulating film 130 by use of the polycrystal silicon film 135 and the silicon nitride film 136. Herein, the silicon nitride film 136 is formed after the patterning of the polycrystal silicon film 135 in accordance with the known method; hence, the exposed surface of the polycrystal silicon film 135 (used for the formation of the dimples 130a) is entirely covered with the silicon nitride film 136. The silicon nitride film 136 is an insulating film which prevents the plate 162 from being short-circuited to the diaphragm 123 even when the diaphragm 123 is fixed to the plate 162.

Figure 33:
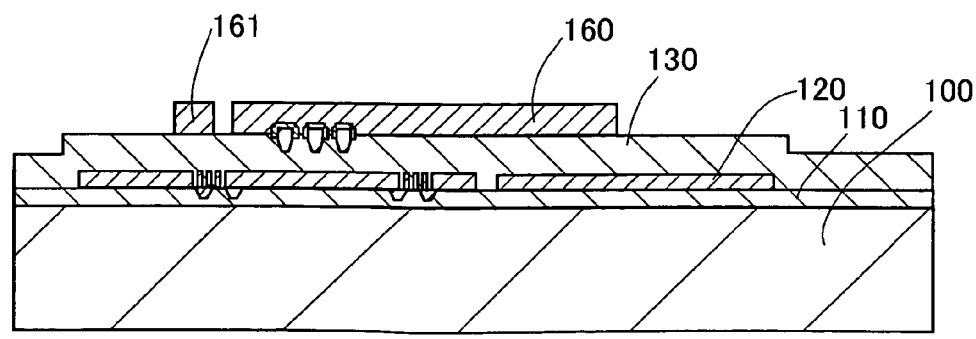
FIG. 33 is a sectional view used for explaining a fourth step of the manufacturing method of the sensor chip of the condenser microphone.

In a fourth step of the manufacturing method shown in FIG. 33, the upper conductive film 160 composed of polycrystal silicon is formed on the exposed surface of the upper insulating film 130 and the surface of the silicon nitride film 136 by way of CVD. The upper conductive film 160 is etched using a photoresist mask so as to form the plate 162, the plate lead 162d, and the etching stopper ring 161. In this step, the plate holes 162c are not formed in the plate 162.

Figure 34:
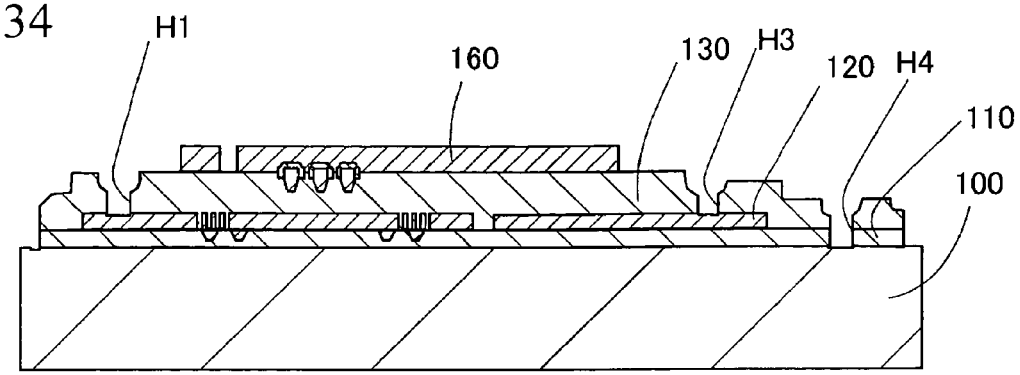
FIG. 34 is a sectional view used for explaining a fifth step of the manufacturing method of the sensor chip of the condenser microphone.

In a fifth step of the manufacturing method shown in FIG. 34, the through-holes H1, H3, and H4 (used for the formation of the contact holes CH1, CH3, and CH4) are formed in the lower insulating film 110 and the upper insulating film 130 by way of anisotropic etching.

Figure 35:
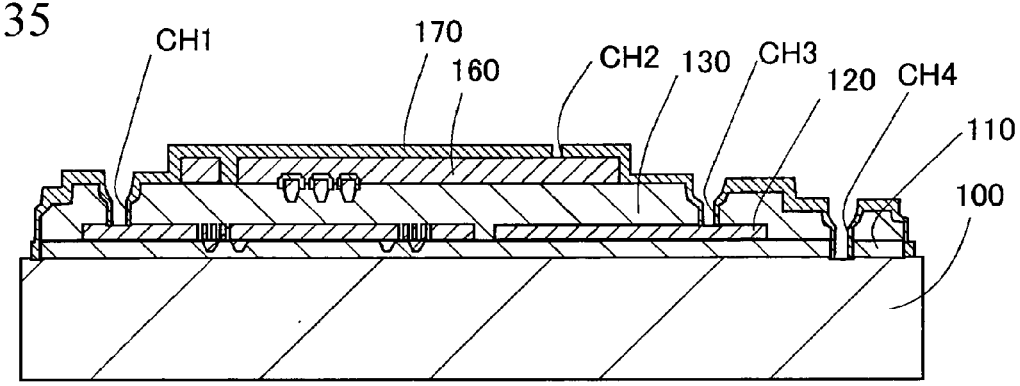
FIG. 35 is a sectional view used for explaining a sixth step of the manufacturing method of the sensor chip of the condenser microphone.

In a sixth step of the manufacturing method shown in FIG. 35, the surface insulating film 170 composed of silicon oxide is formed on the entire surface by way of plasma CVD. Then, etching is performed using a photoresist mask so as to form the contact holes CH1, CH2, CH3, and CH4 in the surface insulating film 170.

Figure 36:
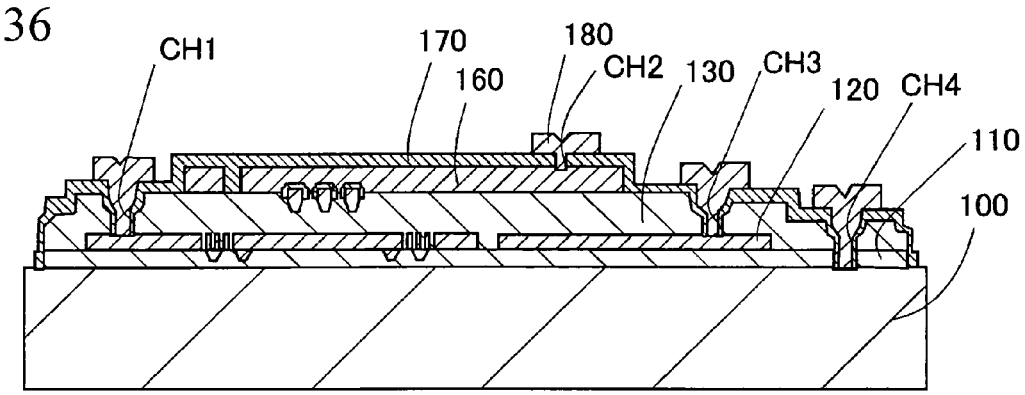
FIG. 36 is a sectional view used for explaining a seventh step of the manufacturing method of the sensor chip of the condenser microphone.

In a seventh step of the manufacturing method shown in FIG. 36, an AlSi film is formed on the entire surface so as to cover the contact holes CH1, CH2, CH3, and CH4 by way of sputtering. Then, etching is performed using a photoresist mask so as to partially remove the AlSi film while leaving the prescribed portions covering the contact holes CH1, CH2, CH3, and CH4, thus forming the pad conductive films 180 composed of AlSi. At this time, the AlSi film is subdivided into the prescribed areas in connection with the contact holes CH1, CH2, CH3, and CH4 while forming the side surfaces defining the outlines of the pad conductive films 180. The patterning of the AlSi film can be achieved by way of wet etching by use of a spin processor using an etchant (e.g. a mixed acid of phosphoric acid, nitric acid, and water) in prescribed conditions at a heating temperature ranging from 60° C. to 75° C. (preferably, 65° C.), processing time ranging from 30 sec to 120 sec (preferably, 60 sec), and rotation speed ranging from 600 rpm to 1,000 rpm (preferably, 800 rpm). Due to wet etching, the side surfaces of the pad conductive films 180 are activated and exposed so that they are easily corroded. On the other hand, in dry etching, the side surfaces of the pad conductive films 180 are exposed to chlorine gas and are processed by etching, so that they are easily corroded.

Figure 37:
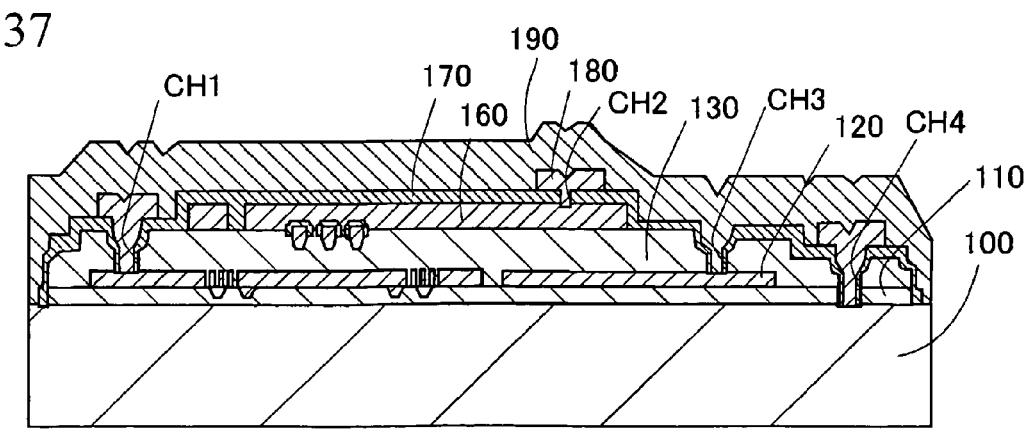
FIG. 37 is a sectional view used for explaining an eighth step of the manufacturing method of the sensor chip of the condenser microphone.

To cope with the above drawback, in an eighth step of the manufacturing method shown in FIG. 37, a deposited film composed of silicon nitride is formed on the entire surface so as to protect the side surfaces of the pad conductive films 180 by way of plasma CVD. Specifically, the silicon nitride film is formed with the thickness of 1.6 µm by way of low-stress plasma CVD in prescribed conditions at a heating temperature of 400° C., pressure of 2.5 Torr, SiH$_4$ flow of 0.3 SLM, NH$_3$ flow of 1.75 SLM, and bias power (RF H/F) of 0.44 kW/0.351 kW.

Figure 38:
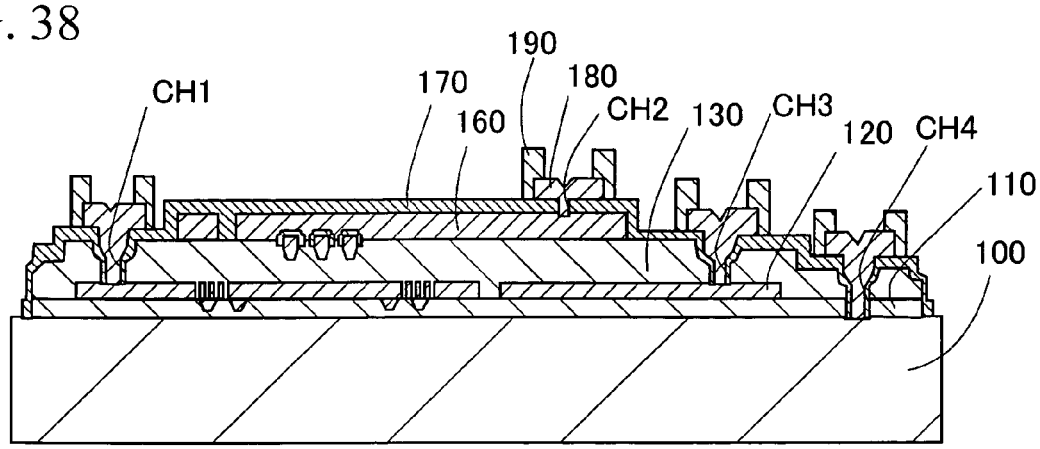
FIG. 38 is a sectional view used for explaining a ninth step of the manufacturing method of the sensor chip of the condenser microphone.

In a ninth step of the manufacturing method shown in FIG. 38 as well as FIG. 13B, the silicon nitride film is partially removed by way of dry etching using a photoresist mask while leaving the surfaces of the pad conductive films 180 (formed in the contact holes CH1, CH2, CH3, and CH4) except for center portions and the surrounding areas of the pad conductive films 180 on the surface insulating film 170. As a result, the pad protective films 190 are formed using the silicon nitride film having superior protection property for protecting the side surfaces of the pad conductive films 180. The patterning of the pad protective films 190 is achieved by way of dry etching using a parallel-plate plasma etcher in prescribed conditions at CF$_4$+O$_2$ mixed gas flow of 150 SCCM, pressure ranging from 0.8 Torr to 1.2 Torr (preferably, 1.0 Torr), bias power of 250 W, and annealing temperature of 80° C. for 130 sec. After annealing of the silicon nitride film which is formed with the thickness of 1.6 µm by way of low-stress plasma CVD, stress ranging from 100 MPa to 1 GPa may remain in the silicon nitride film. In the second embodiment, the patterning is performed in such a way that the pad protective films 190 are locally formed in only the surrounding areas of the pad conductive films 180; hence, it is possible to suppress the distortion of the sensor chip 10 due to relatively high stress remaining in the pad protective films 190.

Figure 39:
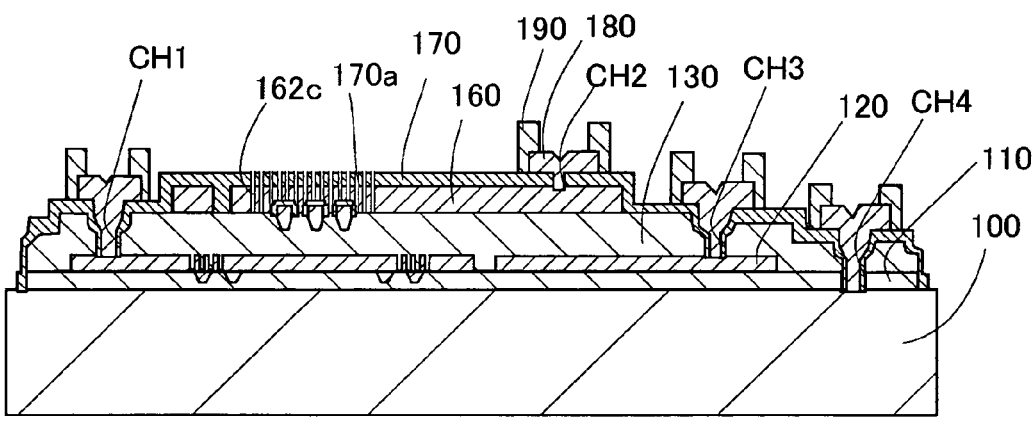
FIG. 39 is a sectional view used for explaining a tenth step of the manufacturing method of the sensor chip of the condenser microphone.

In a tenth step of the manufacturing method shown in FIG. 39, anisotropic etching is performed using a photoresist mask so as to form a plurality of through-holes 170a (corresponding to the plate holes 162c) in the surface insulating film 170, thus forming the plate holes 162c in the upper conductive film 160. This step is consecutively performed using the surface insulating film 170 having the through-holes 170a as a mask for use in etching of the upper conductive film 160.

Figure 40:
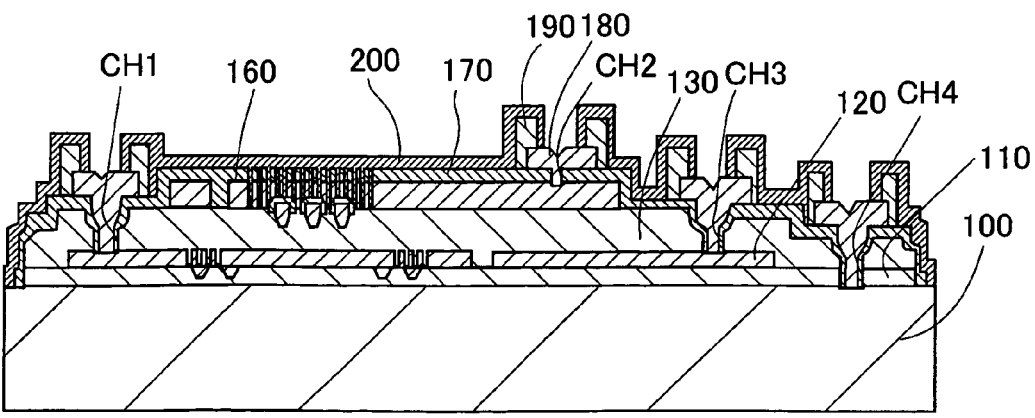
FIG. 40 is a sectional view used for explaining an eleventh step of the manufacturing method of the sensor chip of the condenser microphone.

In an eleventh step of the manufacturing method shown in FIG. 40, the plating protective film 200 composed of silicon oxide is formed on the surface insulating film 170 and the pad protective films 190. At this time, the plating protective film 200 is embedded in the plate holes 162c and the through-holes 170a of the surface insulating film 170. The plating protective film 200 is subjected to patterning by way of etching using a photoresist mask, thus exposing the center portions of the surfaces of the pad conductive films 180 covering the contact holes CH1, CH2, CH3, and CH4.

Figure 41:
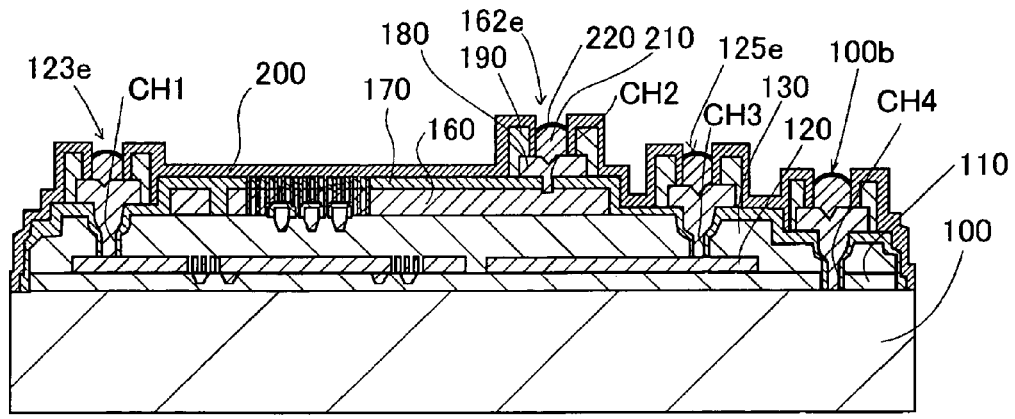
FIG. 41 is a sectional view used for explaining a twelfth step of the manufacturing method of the sensor chip of the condenser microphone.

In a twelfth step of the manufacturing method shown in FIG. 41, the bump films 210 composed of Au are formed on the surfaces of the pad conductive films 180, which are formed in the contact holes CH1, CH2, CH3, and CH4 and are exposed in the through-holes of the plating protective film 200, by way of electroless plating. In addition, the backside of the substrate 100 is polished so as to achieve a desired thickness of the substrate 100 for use in an actual product.

Figure 42:
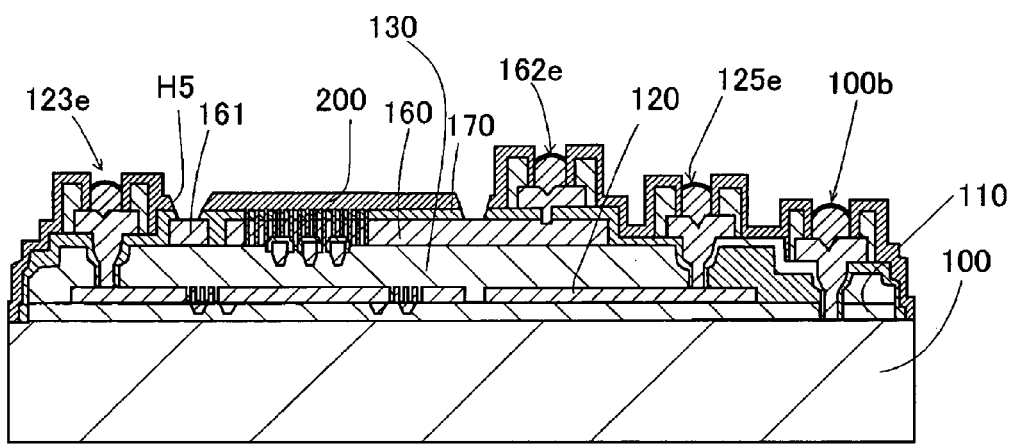
FIG. 42 is a sectional view used for explaining a thirteenth step of the manufacturing method of the sensor chip of the condenser microphone.

In a thirteenth step of the manufacturing method shown in FIG. 42, etching is performed using a photoresist mask so as to form the through-hole H5 for exposing the etching stopper ring 161 in the plating protective film 200 and the surface insulating film 170. This substantially completes the processing on the surface of the substrate 100.

Figure 43:
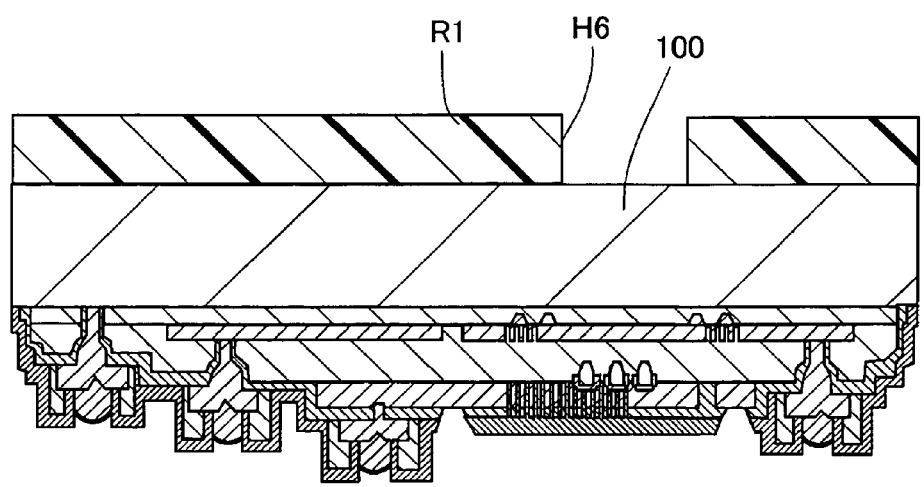
FIG. 43 is a sectional view used for explaining a fourteenth step of the manufacturing method of the sensor chip of the condenser microphone.

In a fourteenth step of the manufacturing method shown in FIG. 43, the photoresist mask R1 having the through-hole H6 is formed on the backside of the substrate 100 in order to form a through-hole corresponding to the back cavity C1 in the substrate 100.

Figure 44:
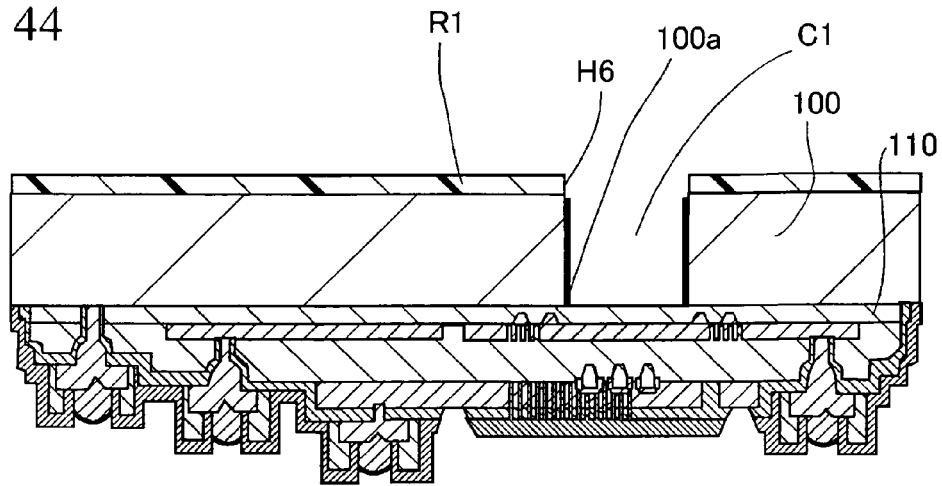
FIG. 44 is a sectional view used for explaining a fifteenth step of the manufacturing method of the sensor chip of the condenser microphone.

In a fifteenth step of the manufacturing method shown in FIG. 44, the through-hole of the substrate 100 is formed by way of Deep-RIE. At this time, the lower insulating film 110 serves as an etching stopper.

Figure 45:
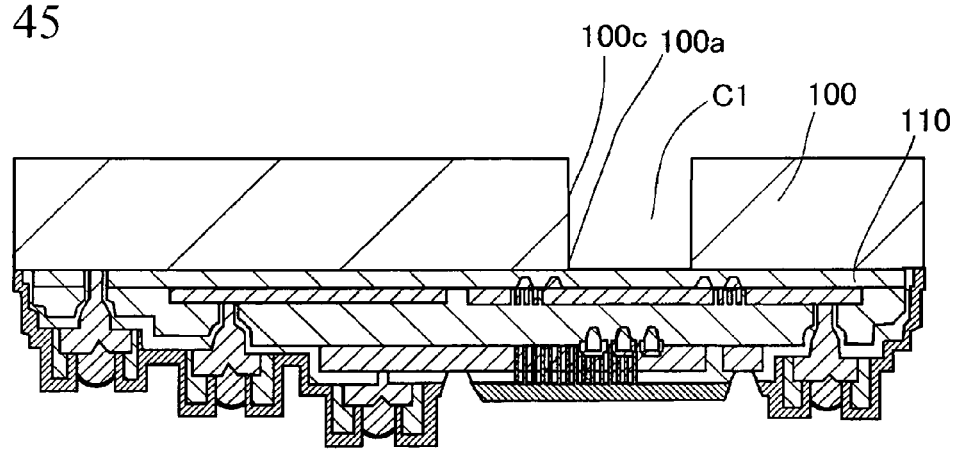
FIG. 45 is a sectional view used for explaining a sixteenth step of the manufacturing method of the sensor chip of the condenser microphone.

In a sixteenth step of the manufacturing method shown in FIG. 45, the photoresist mask R1 is removed from the backside of the substrate 100; then, unnecessary deposits attached to an interior wall 100c of the through-hole which is roughly formed in the substrate 100 by way of Deep-RIE.

Figure 46:
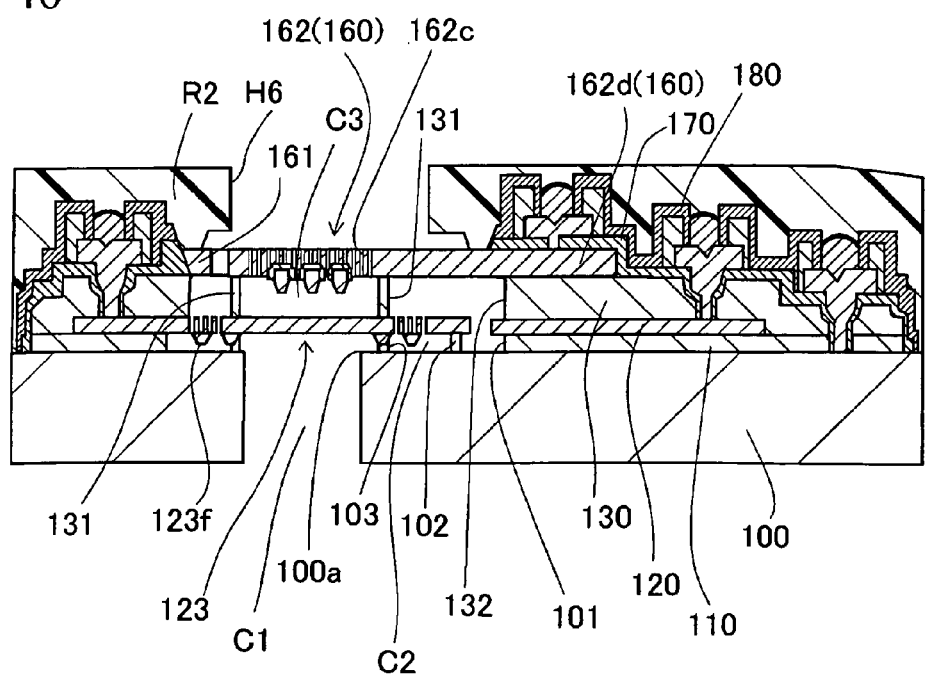
FIG. 46 is a sectional view used for explaining a seventeenth step of the manufacturing method of the sensor chip of the condenser microphone.

In a seventeenth step of the manufacturing method shown in FIG. 46, isotropic etching is performed using the photoresist mask R2 and buffered hydrofluoric acid (BHF) so as to remove the plating protective film 200 and the surface insulating film 170 from above the plate 162 and the plate lead 162d. In addition, a part of the upper insulating film 130 is removed so as to form the ring-shaped portion 132, the plate spacers 131, and the gap layer C3. Furthermore, a part of the lower insulating film 110 is removed so as to form the guard spacers 103, the diaphragm spacers 102, the ring-shaped portion 101, and the gap layer C2. At this time, an etchant (i.e. BHF) enters into the through-hole H6 of the photoresist mask R2 and the opening 100a of the substrate 100. The outline of the upper insulating film 130 is defined by the plate 162 and the plate lead 162d. That is, the ring-shaped portion 132 and the plate spacers 131 are formed by way of self-alignment of the plate 162 and the plate lead 162d.

Figure 47:
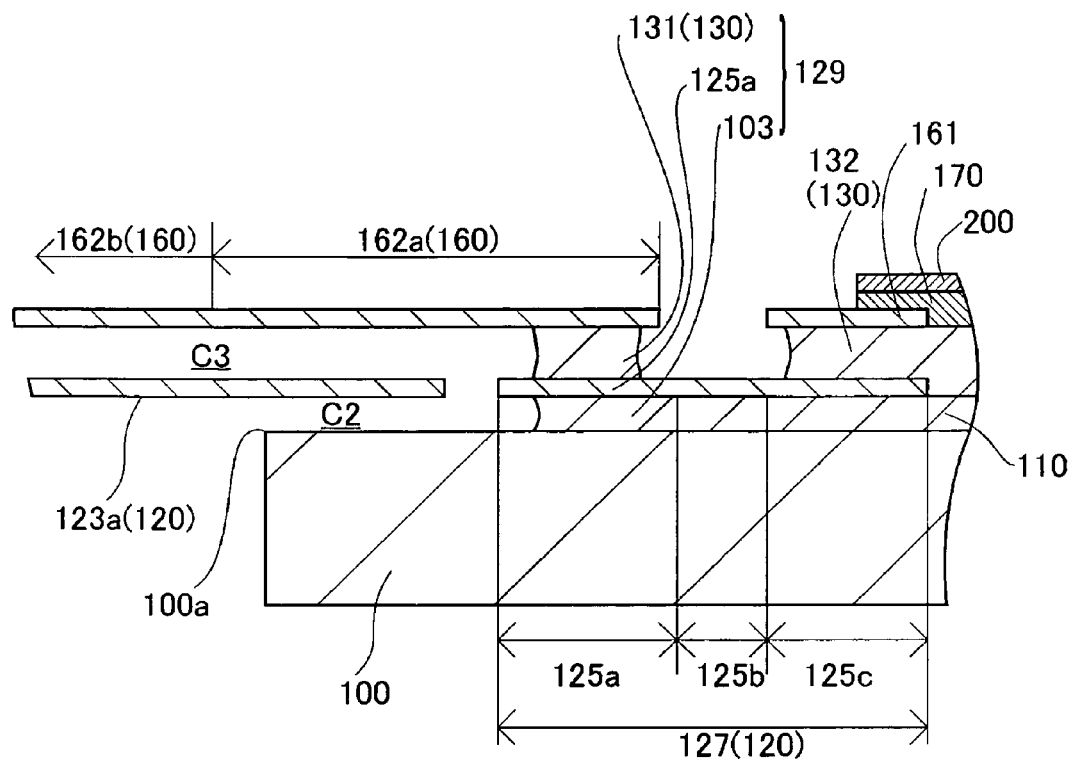
FIG. 47 is a sectional view showing a prescribed part of the sensor chip having undercuts due to anisotropic etching.
Figure 48:
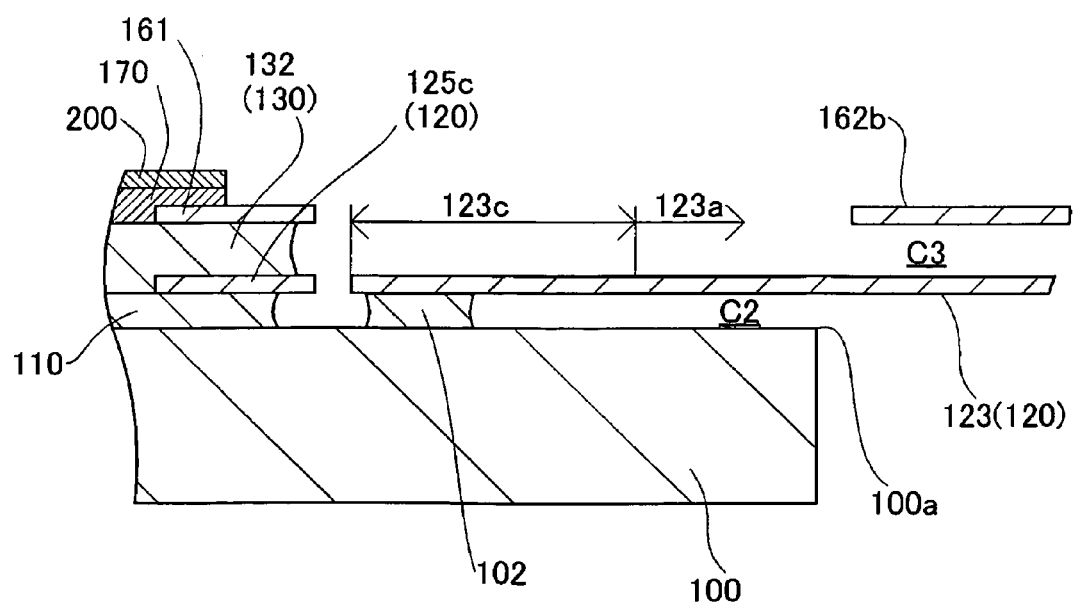
FIG. 48 is a sectional view showing another part of the sensor chip having undercuts due to anisotropic etching.

As shown in FIG. 47, undercuts are formed in the edges of the ring-shaped portion 132 and the plate spacers 131 due to anisotropic etching. The outline of the lower insulating film 110 is defined by the opening 100a of the substrate 100, the diaphragm 123, the diaphragm lead 123d, the guard electrodes 125a, the guard connectors 125b, and the guard ring 125c, wherein the guard spacers 103 and the diaphragm spacers 102 are formed by way of self-alignment. As shown in FIGS. 47 and 48, undercuts are formed on the edges of the guard spacers 103 and the plate spacers 131 due to anisotropic etching. In this process, the guard spacers 103 and the plate spacers 131 are formed together with the spacers 129 for supporting the plate 162 above the substrate 100 except for the guard electrodes 125a.

Thereafter, the photoresist mask R2 is removed; then, the substrate 100 is subjected to dicing, thus completing the production of the sensor chip 10 for use in a condenser microphone. The sensor chip 10 and the circuit chip are bonded onto a package substrate (not shown); the terminals 125e, 162e, 123e, and 100b of the sensor chip 10 are electrically connected to the terminals of the circuit chip (not shown) by way of wire bonding; then, the package substrate is covered with a package cover (not shown), thus completing the production of the condenser microphone. When the sensor chip is attached to the package substrate, the opening of the back cavity C1 at the backside of the substrate 100 is closed in an airtight manner.

(4) Variations

The second embodiment can be modified in a variety of ways. For example, it is possible to produce the condenser microphone having a single-chip structure by incorporating the circuit elements such as the charge pump CP and the amplifier A (which is originally installed in the circuit chip) into the sensor chip 10, which has at least one chip corresponding to the terminals 125e, 162e, 123e, and 100b. It is preferable that the pad protective films 190 be formed in narrow areas as long as they cover the side surfaces of the pad conductive films 180 (serving as electrode films), wherein the pad protective films 190 can be formed in any shapes such as circular shapes, polygonal shapes, and ring shapes, and wherein the pad protective films 190 can be integrally formed and unified with respect to the combination of the terminals 123e and 100b and the combination of the terminals 125e and 162e respectively. Alternatively, it is possible to concentrate the alignment of the terminals 125e, 162e, 123e, and 100b in a very small area so that the pad protective films 190 therefor are integrally united together.

In the first and second embodiments, the materials and dimensions are merely illustrative and not restrictive, wherein the addition and deletion of processes and the change of the order of processes, which those skilled in the art can easily anticipate, are omitted in the descriptions. In manufacturing processes, for example, the compositions of films, the film formation methods, the methods for defining outlines of films, and the order of processes can be appropriately selected in response to the combination of film materials whose properties satisfy the requirements of condenser microphones, the thicknesses of films, and the required precisions of defining outlines of films.

Moreover, the present invention can be applied to any types of electronic devices and sensors except condenser microphones, such as ultrasonic sensors, vibration transducers, pressure sensors, and acceleration sensors.

Lastly, the present invention is not necessarily limited to the above embodiments and variations, which can be further modified in a variety of ways within the scope of the invention as defined in the appended claims.

What is claimed is:

1. An MEMS transducer comprising:
   a diaphragm having conductivity;
   a plate having conductivity;
   a support structure for supporting the diaphragm and the plate with a gap layer therebetween, wherein the support structure has an interior wall surrounding the gap layer;
   an electrode film having conductivity for covering a contact hole formed in the support structure; and
   a protective film which is formed on the support structure externally of the interior wall so as to cover a side surface of the electrode film, wherein an electric signal corresponding to variations of an electrostatic capacitance formed between the diaphragm and the plate is output via the electrode film.

2. An MEMS transducer according to claim 1, wherein the protective film is composed of silicon nitride or silicon nitride oxide.

3. An MEMS transducer according to claim 2, wherein the support structure has a multilayered structure including a silicon substrate and a silicon oxide film which joins the silicon substrate except for its periphery, and wherein the protective film is formed in a region extended between the periphery of the silicon substrate and a periphery of the silicon oxide film.

4. An MEMS transducer comprising:
a diaphragm having conductivity;
a plate having conductivity;
an insulating member for insulating the diaphragm from the plate;
an electrode film which is composed of a conductive film so as to cover a contact hole formed in the insulating member; and
a protective film which is limitedly formed in a part of a surface of the electrode film and a surrounding area of the electrode film on a surface of the insulating member, thus covering a side surface of the electrode film,
wherein an electric signal corresponding to variations of electrostatic capacitance formed between the diaphragm and the plate is output from the electrode film.

5. An MEMS transducer according to claim 4, wherein the protective film is composed of silicon nitride or silicon nitride oxide.

6. An MEMS transducer according to claim 4, wherein the protective film is formed on the surface of the electrode film except for its center portion.

* * * * *